(12) United States Patent
Shirai

(10) Patent No.: US 12,176,269 B2
(45) Date of Patent: Dec. 24, 2024

(54) SEMICONDUCTOR DEVICE

(71) Applicant: ROHM CO., LTD., Kyoto (JP)

(72) Inventor: Katsutoki Shirai, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 290 days.

(21) Appl. No.: 17/697,804

(22) Filed: Mar. 17, 2022

(65) Prior Publication Data

US 2022/0301985 A1 Sep. 22, 2022

(30) Foreign Application Priority Data

Mar. 22, 2021 (JP) ................. 2021-047149

(51) Int. Cl.
*H01L 23/495* (2006.01)
*H01L 23/00* (2006.01)
(52) U.S. Cl.
CPC .. *H01L 23/49503* (2013.01); *H01L 23/49541* (2013.01); *H01L 23/49548* (2013.01); *H01L 23/49565* (2013.01); *H01L 24/48* (2013.01); *H01L 24/49* (2013.01); *H01L 2224/4801* (2013.01); *H01L 2224/48245* (2013.01); *H01L 2224/4845* (2013.01); *H01L 2224/48455* (2013.01); *H01L 2224/4903* (2013.01);
(Continued)
(58) Field of Classification Search
CPC ... H01L 2224/04042; H01L 2224/0603; H01L 2224/49171; H01L 23/49541; H01L 24/06; H01L 24/49; H01L 2224/4903
See application file for complete search history.

(56) References Cited

U.S. PATENT DOCUMENTS 6,166,430 A * 12/2000 Yamaguchi ......... H01L 23/3121
257/E23.125
2008/0290486 A1* 11/2008 Chen ...................... H01L 24/06
257/676

(Continued)

FOREIGN PATENT DOCUMENTS

JP 2011077216 A 4/2011
JP 2012084806 A 4/2012

(Continued)

OTHER PUBLICATIONS

Office Action issued in Japanese Application No. 2021-047149, dated Oct. 22, 2024, with English machine translation.

*Primary Examiner* — Jaehwan Oh
(74) *Attorney, Agent, or Firm* — HSML P. C.

(57) ABSTRACT

A semiconductor device, includes: a semiconductor element having element main surface and element back surface spaced apart from each other in thickness direction and including a plurality of main surface electrodes arranged on the element main surface; a die pad having a die pad main surface where the semiconductor element is mounted; a plurality of leads including at least one first lead arranged on one side in first direction orthogonal to the thickness direction with respect to the die pad, and arranged around the die pad when viewed in the thickness direction; a plurality of connecting members including a first connecting member bonded to the at least one first lead, and configured to electrically connect the main surface electrodes and the leads; and a resin member configured to seal the semiconductor element, a part of the die pad, parts of the leads, and the connecting members.

17 Claims, 24 Drawing Sheets

(52) U.S. Cl.
    CPC .. *H01L 2924/182* (2013.01); *H01L 2924/183* (2013.01); *H01L 2924/186* (2013.01)

(56) References Cited

U.S. PATENT DOCUMENTS

| | | | |
|---|---|---|---|
| 2012/0153444 A1* | 6/2012 | Haga | H01L 24/85 |
| | | | 257/737 |
| 2012/0205790 A1* | 8/2012 | Haga | H01L 21/4842 |
| | | | 257/676 |
| 2016/0336277 A1* | 11/2016 | Kageyama | H01L 24/03 |
| 2020/0091060 A1* | 3/2020 | Saito | H01L 23/3107 |

FOREIGN PATENT DOCUMENTS

| | | |
|---|---|---|
| JP | 2013-239740 A | 11/2013 |
| JP | 2017069584 A | 4/2017 |
| JP | 2020047758 A | 3/2020 |

* cited by examiner

SEMICONDUCTOR DEVICE

CROSS-REFERENCE TO RELATED APPLICATION

This application is based upon and claims the benefit of priority from Japanese Patent Application No. 2021-047149, filed on Mar. 22, 2021, the entire contents of which are incorporated herein by reference.

TECHNICAL FIELD

The present disclosure relates to a semiconductor device.

BACKGROUND

There is a surface mount type package that enables surface mounting of a semiconductor device on a wiring board for mounting the semiconductor device on the wiring board at a high density. As the surface mount type package, for example, a MAP (Mold Array Package) type SON (Small Outlined Non-leaded Package) and a QFN (Quad Flat Non-leaded Package) are known. In the related art, there is known a semiconductor device to which a MAP type QFN is applied. In the related art, the semiconductor device includes a semiconductor chip, a die pad, leads, bonding wires, and a sealing resin. The semiconductor chip is bonded to the die pad. The leads are placed around the die pad. The bonding wires electrically connect the semiconductor chip and the leads. The sealing resin seals the semiconductor chip, the die pad, the leads, and the bonding wires.

In order to achieve higher performance and higher quality of a semiconductor device, not only higher performance and higher quality of a semiconductor chip, but also modification of a package structure of a semiconductor device is required.

SUMMARY

Some embodiments of the present disclosure provide a semiconductor device with higher performance and higher quality.

According to an embodiment of the present disclosure, there is provided a semiconductor device, including: a semiconductor element having an element main surface and an element back surface spaced apart from each other in a thickness direction and including a plurality of main surface electrodes arranged on the element main surface; a die pad having a die pad main surface on which the semiconductor element is mounted; a plurality of leads including at least one first lead arranged on one side in a first direction orthogonal to the thickness direction with respect to the die pad, and arranged around the die pad when viewed in the thickness direction; a plurality of connecting members including a first connecting member bonded to the at least one first lead, and configured to electrically connect the plurality of main surface electrodes and the plurality of leads; and a resin member configured to seal the semiconductor element, a part of the die pad, parts of the plurality of leads, and the plurality of connecting members, wherein each of the plurality of leads is configured to entirely overlap with the resin member when viewed in the thickness direction and arranged along an outer edge of the resin member when viewed in the thickness direction, wherein the die pad includes a first portion, a second portion, a third portion, and a fourth portion, wherein the die pad main surface spans the first portion, the second portion, the third portion, and the fourth portion, wherein the first portion has a first back surface facing a side opposite to the die pad main surface and overlaps with the semiconductor element when viewed in the thickness direction, wherein the second portion has a second back surface facing a side opposite to the die pad main surface and located closer to the die pad main surface than the first back surface in the thickness direction, and is connected to an outer edge of the first portion when viewed in the thickness direction, wherein the third portion has a third back surface facing a side opposite to the die pad main surface and being flush with the first back surface, and extends from one end edge of the first portion to one end edge of the die pad main surface in a second direction orthogonal to the thickness direction and the first direction, and wherein the fourth portion has a fourth back surface facing a side opposite to the die pad main surface and being flush with the first back surface, and extends from the other end edge of the first portion to the other end edge of the die pad main surface in the second direction.

BRIEF DESCRIPTION OF DRAWINGS

The accompanying drawings, which are incorporated in and constitute a part of the specification, illustrate embodiments of the present disclosure.

DETAILED DESCRIPTION

Figure 1:
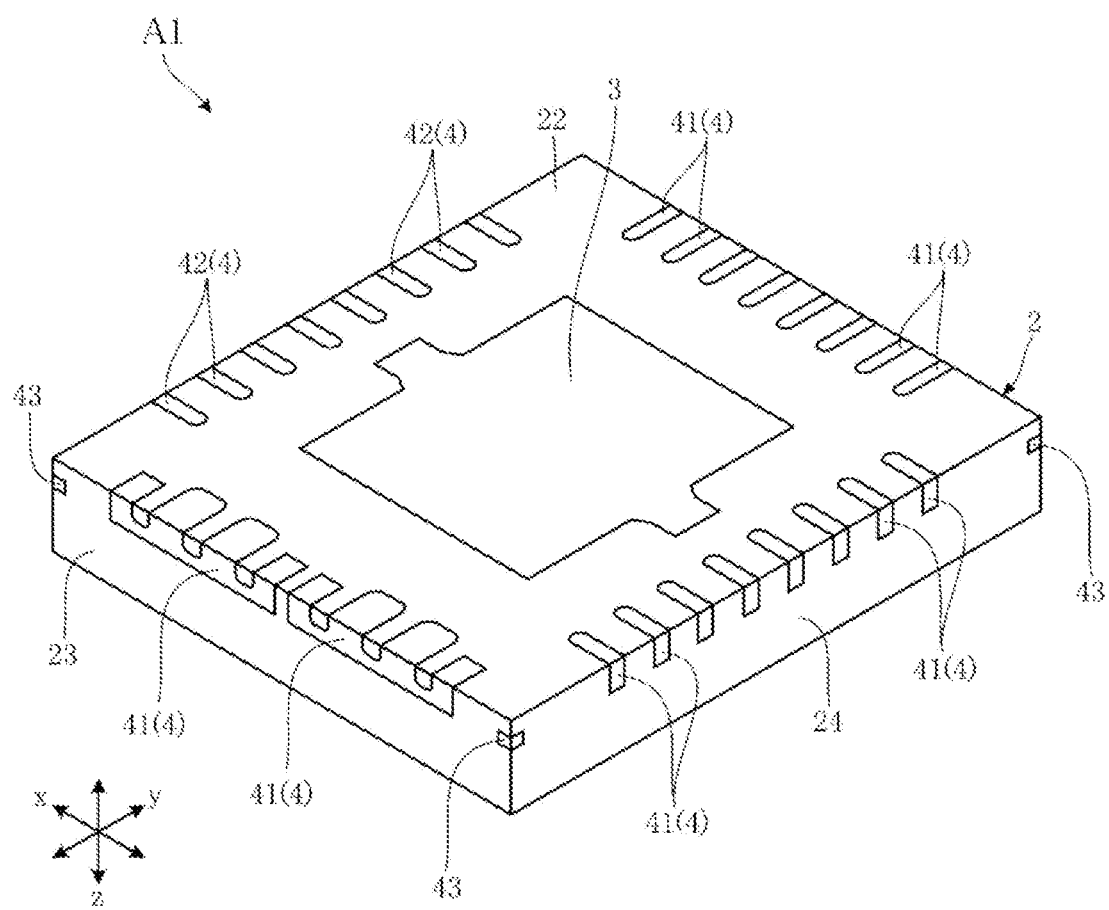
FIG. 1 is a perspective view (back side) showing a semiconductor device according to a first embodiment of the present disclosure.

Embodiments of a semiconductor device of the present disclosure will be described below with reference to the drawings. Hereinafter, the same or similar elements are designated by the same reference numerals and duplicated description thereof will be omitted. The terms such as "first," "second," "third," and the like in the present disclosure are used merely as labels and are not necessarily intended to indicate an order of those objects.

In the present disclosure, "a certain object A being formed in a certain object B" and "a certain object A being formed on a certain object B" include "the certain object A being formed directly in the certain object B" and "the certain object A being formed in the certain object B with another object interposed between the certain object A and the certain object B," unless otherwise specified. Similarly, "a certain object A being arranged in a certain object B" and "a certain object A being arranged on a certain object B" include "the certain object A being arranged directly in the certain object B" and "the certain object A being arranged in the certain object B with another object interposed between the certain object A and the certain object B," unless otherwise specified. Similarly, "a certain object A being positioned on a certain object B" includes "the certain object A being positioned on the certain object B with the certain object A in contact with the certain object B" and "the certain object A being positioned on the certain object B with another object interposed between the certain object A and the certain object B," unless otherwise specified. In addition, "a certain object A overlapping with a certain object B as viewed in a certain direction" includes "the certain object A overlapping with the entirety of the certain object B" and "the certain object A overlapping with a part of the certain object B," unless otherwise specified.

Figure 5:
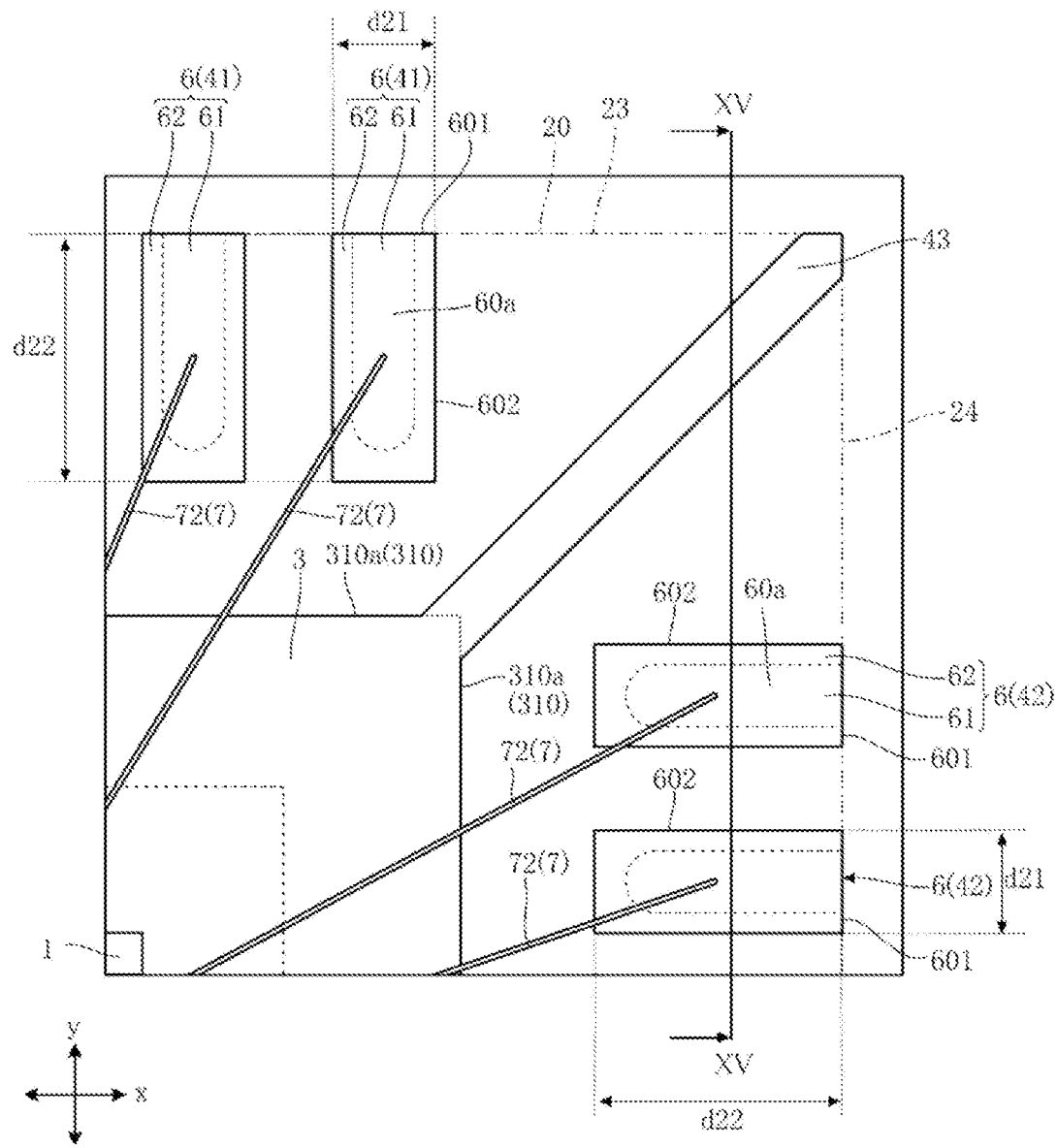
FIG. 5 is an enlarged view of a part (second lead) in FIG. 3.
Figure 6:
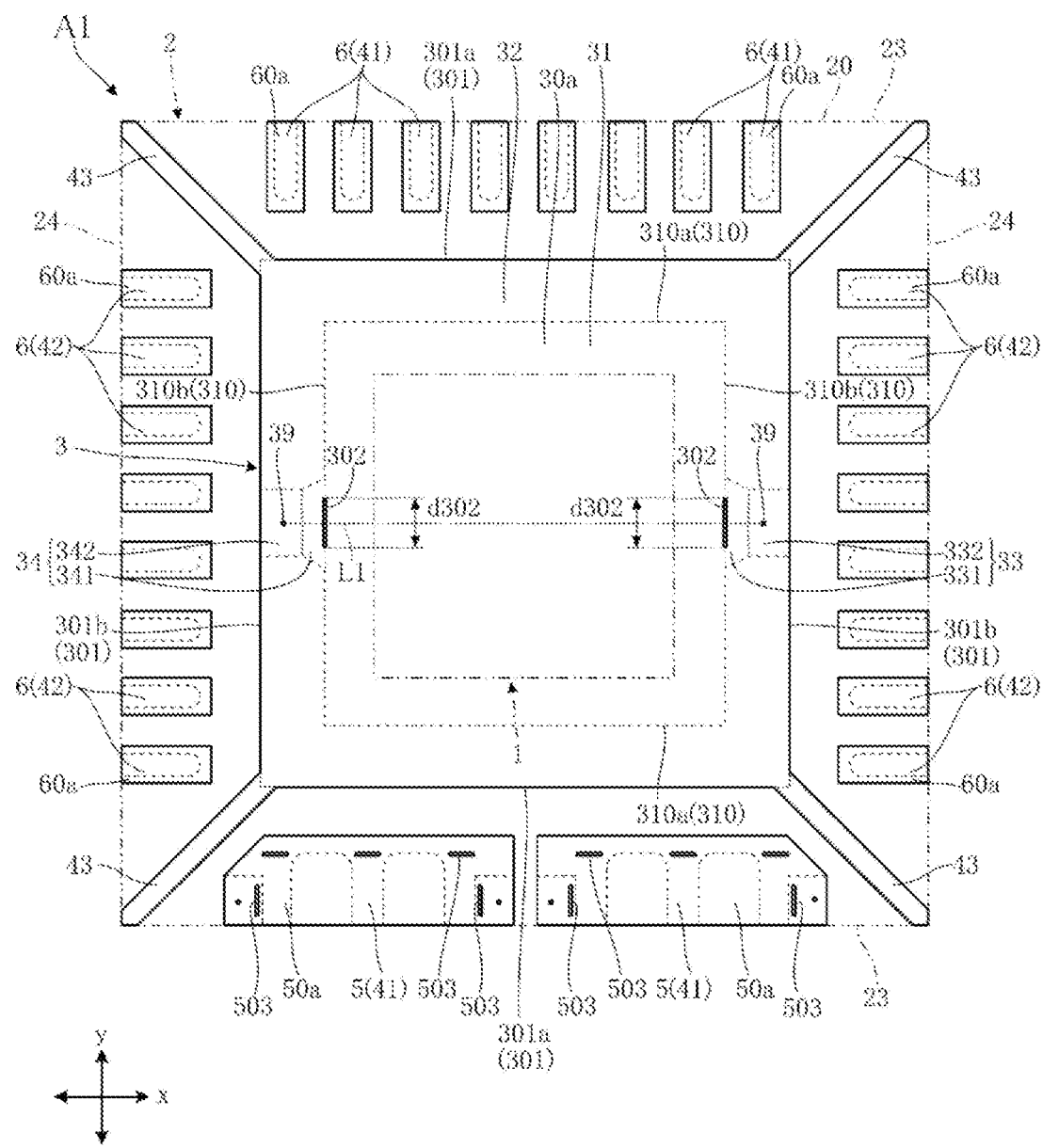
FIG. 6 is a view in which a plurality of connecting members is omitted from the plan view of FIG. 3.

FIGS. 1 to 15 show a semiconductor device A1 according to a first embodiment of the present disclosure. The semiconductor device A1 includes a semiconductor element 1, a resin member 2, a die pad 3, a plurality of leads 4, a plurality of third leads 43, and a plurality of connecting members 7. The plurality of leads 4 includes a plurality of first side leads 41 and a plurality of second side leads 42 and includes a first lead 5 and a second lead 6. The plurality of connecting members 7 includes a plurality of first connecting members 71 and a plurality of second connecting members 72. In FIG. 6, the semiconductor element 1 is indicated by an imaginary line. In FIGS. 3 to 6, the resin member 2 is indicated by an imaginary line.

For convenience of explanation, the thickness direction of each of the semiconductor element 1, the resin member 2, the die pad 3, and the plurality of leads 4 is referred to as "thickness direction z." One side in the thickness directions z may be referred to as an upper side, and the other side may be referred to as a lower side. Further, in the following description, "in a plan view" refers to being viewed along the thickness direction z. The direction orthogonal to the thickness direction z is referred to as "first direction y." The first direction y is the vertical direction in the plan view (see FIGS. 2 and 3) of the semiconductor device A1. The direction orthogonal to the thickness direction z and the first direction y is referred to as "second direction x." The second direction x is the left-right direction in the plan view (see FIGS. 2 and 3) of the semiconductor device A1.

The semiconductor device A1 is a surface mount type package. The package structure of the semiconductor device A1 is, for example, a MAP type QFN. The semiconductor device A1 has a rectangular shape in the plan view. In the semiconductor device A1, the dimension in the first direction y is, for example, 3 mm or more and 12 mm or less, and the dimension in the second direction x is, for example, 3 mm or more and 12 mm or less. Further, in the semiconductor device A1, the dimension in the thickness direction z is, for example, 0.5 mm or more and 1.5 mm or less.

Figure 3:
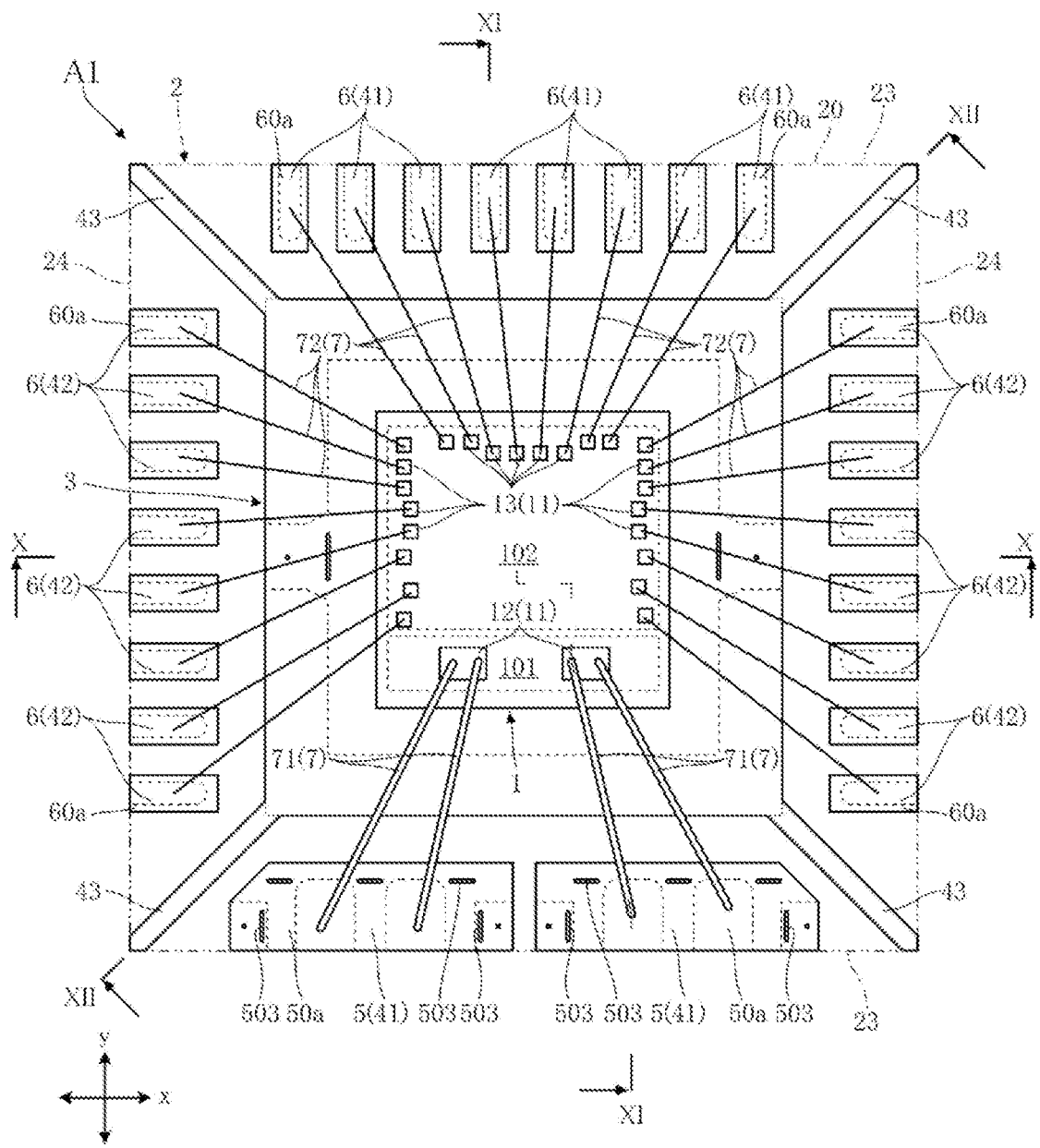
FIG. 3 is a view in which a resin member is made transparent in the plan view of FIG. 2.

The semiconductor element 1 is an element that exerts an electrical function of the semiconductor device A1. The semiconductor element 1 has a rectangular shape in the plan view. The semiconductor element 1 is, for example, an integrated circuit element, but may be an active function element, a passive function element, or the like. In the present embodiment, the semiconductor element 1 is a power IC and includes a power component 101 and a control circuit component 102 as shown in FIG. 3. The power component 101 includes a power element such as a transistor or the like. The control circuit component 102 is a control circuit configured to control the power element of the power component 101. In the example shown in FIG. 3, in the plan view, the power component 101 is arranged on one side (a lower side in FIG. 3) of the control circuit component 102 in the first direction y. The semiconductor element 1 is not limited to a configuration including the power component 101 and the control circuit component 102 and may include only one of the power component 101 and the control circuit component 102.

Figure 10:
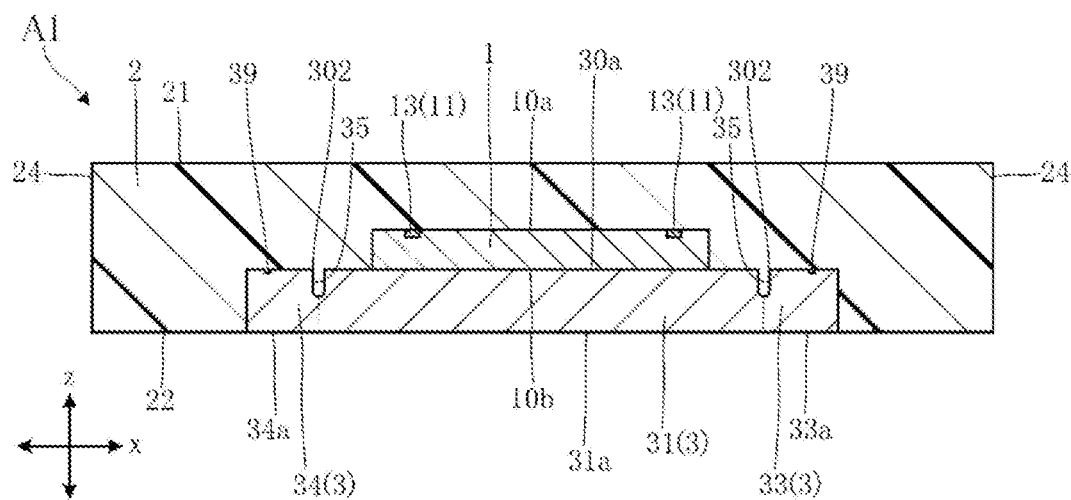
FIG. 10 is a cross-sectional view taken along line X-X in FIG. 3.
Figure 11:
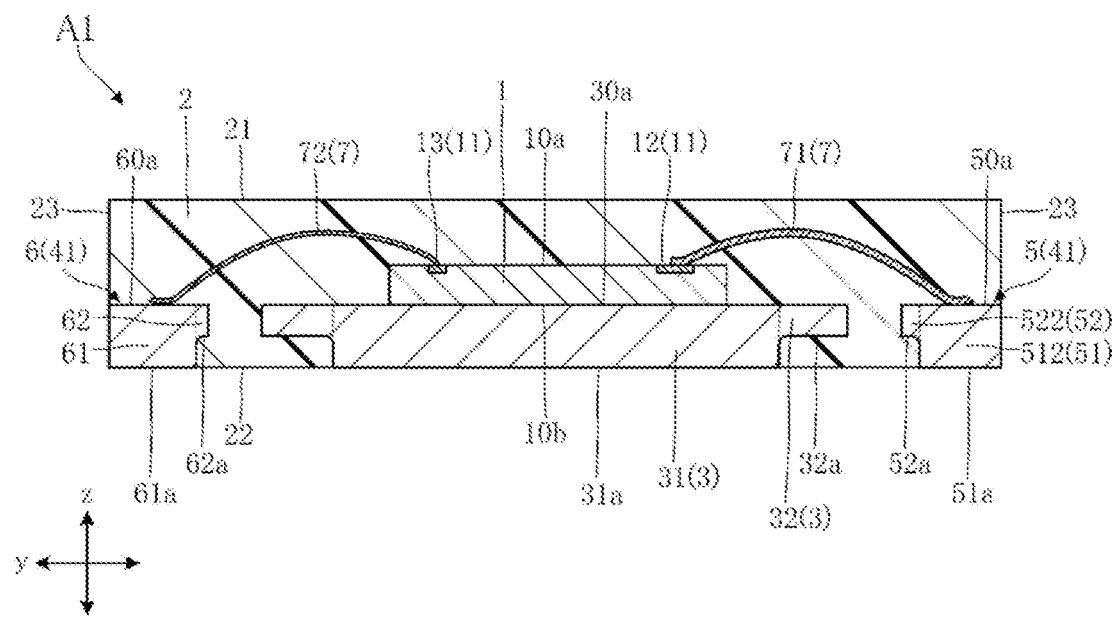
FIG. 11 is a cross-sectional view taken along line XI-XI in FIG. 3.
Figure 12:
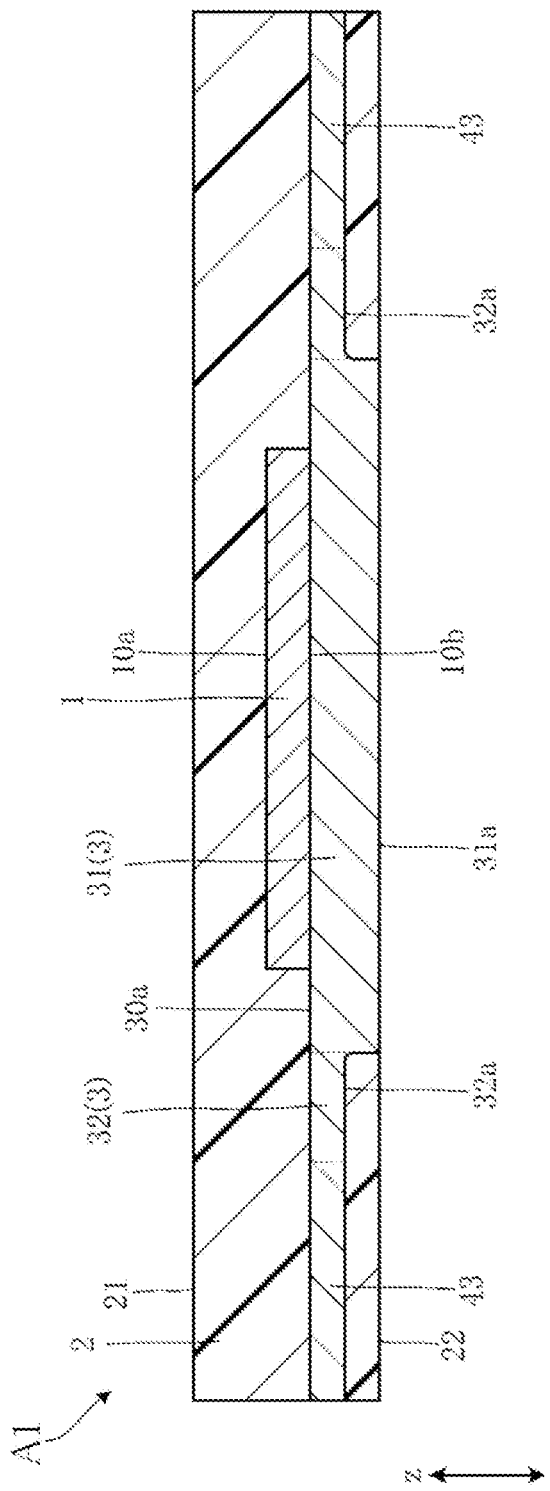
FIG. 12 is a cross-sectional view taken along line XII-XII in FIG. 3.

As shown in FIGS. 10 to 12, the semiconductor element 1 has an element main surface 10a and an element back surface 10b. The element main surface 10a and the element back surface 10b are spaced apart from each other in the thickness direction z and face opposite sides. The element main surface 10a faces the upper side in the thickness direction z, and the element back surface 10b faces the lower side in the thickness direction z.

As shown in FIGS. 10 and 11, the semiconductor element 1 includes a plurality of main surface electrodes 11 arranged on the element main surface 10a. As shown in FIG. 3, the plurality of main surface electrodes 11 includes a plurality of first main surface electrodes 12 and a plurality of second main surface electrodes 13. Each of the plurality of first main surface electrodes 12 is electrically connected to the power component 101. Each of the plurality of second main surface electrodes 13 is electrically connected to the control circuit component 102. The number, arrangement, shape and plan-view dimensions of the plurality of main surface electrodes 11 (the plurality of first main surface electrodes 12 and the plurality of second main surface electrodes 13) are not limited to the examples shown in FIG. 3 and may be changed appropriately according to the semiconductor element 1 used.

The semiconductor element 1 is bonded to the die pad 3 by, for example, a bonding material (not shown). The bonding material may be insulating or conductive. However, when the electrodes are arranged on the element back surface 10b of the semiconductor element 1, the semiconductor element 1 is bonded to the die pad 3 by a conductive bonding material, such that the electrodes arranged on the element back surface 10b are electrically connected to the die pad 3 via the conductive bonding material.

The resin member 2 is a sealing material that protects the semiconductor element 1. The resin member 2 is made of an insulating resin material. The resin material is, for example, a black epoxy resin. The resin member 2 covers, for example, the semiconductor element 1, a part of the die pad 3, parts of a plurality of leads 4, parts of the plurality of third leads 43, and the plurality of connecting members 7. The resin member 2 has a rectangular shape in the plan view. The resin member 2 has a resin main surface 21, a resin back surface 22, a pair of first resin side surfaces 23, and a pair of second resin side surfaces 24.

As shown in FIGS. 8 to 12, the resin main surface 21 and the resin back surface 22 are spaced apart from each other in the thickness direction z and face opposite sides. The resin main surface 21 faces the upper side in the thickness direction z, and the resin back surface 22 faces the lower side in the thickness direction z.

Figure 2:
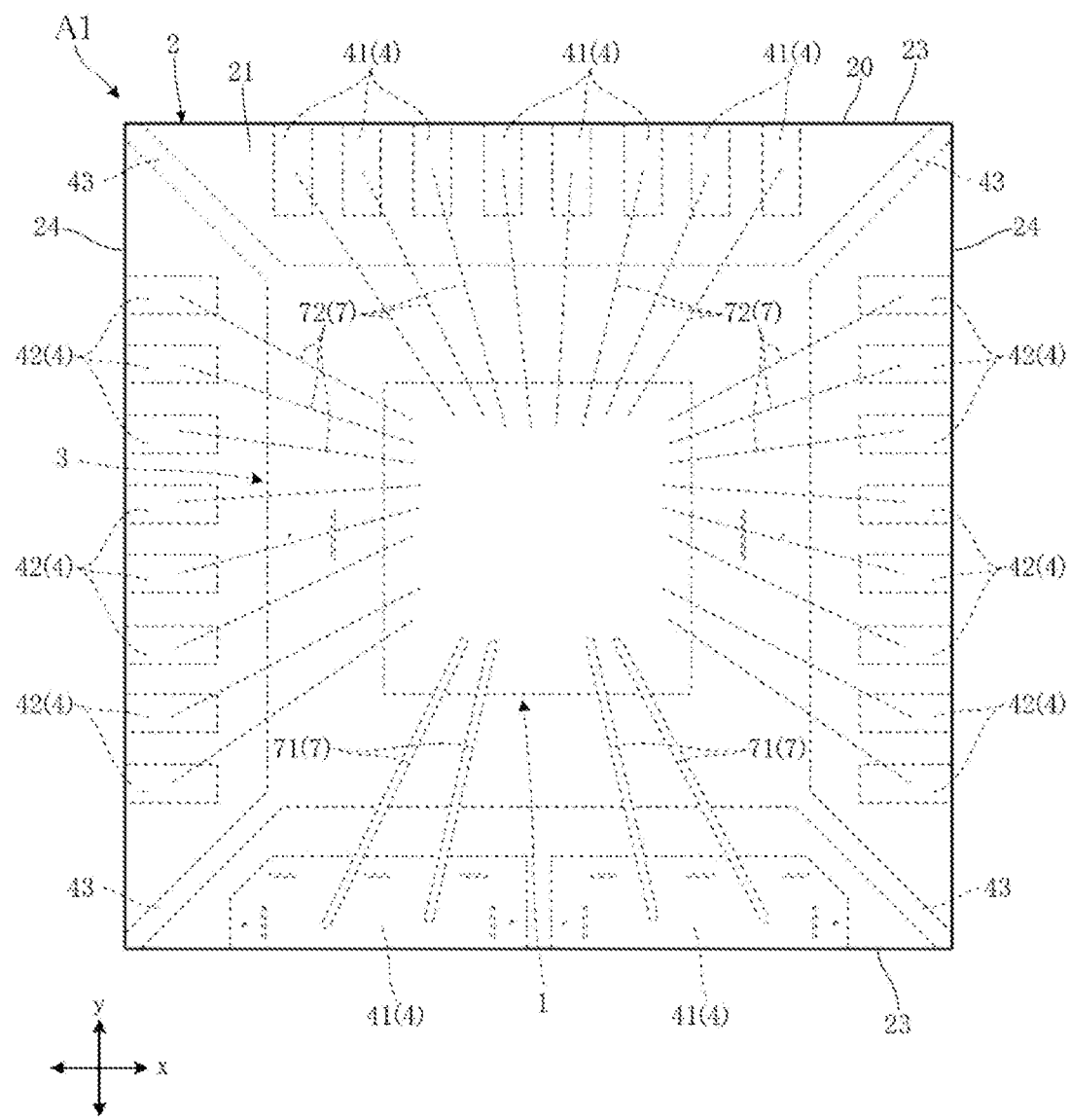
FIG. 2 is a plan view showing a semiconductor device according to the first embodiment of the present disclosure.

The pair of first resin side surfaces 23 and the pair of second resin side surfaces 24 are connected to both the resin main surface 21 and the resin back surface 22, respectively, and are interposed between the resin main surface 21 and the resin back surface 22 in the thickness direction z. The pair of first resin side surfaces 23 and the pair of second resin side surfaces 24 respectively extend upward from the resin back surface 22 and stand upright in the illustrated example. The pair of first resin side surfaces 23 are spaced apart from each other in the first direction y and are arranged substantially in parallel. The pair of first resin side surfaces 23 face opposite sides. The pair of second resin side surfaces 24 are spaced apart from each other in the second direction x and are arranged substantially in parallel. The pair of second resin side surfaces 24 face opposite sides. As shown in FIGS. 2 and 3, an outer edge 20 of the resin member 2 in the plan view overlaps with the pair of first resin side surfaces 23 and the pair of second resin side surfaces 24.

The semiconductor element 1 is mounted on the die pad 3. The die pad 3 has a rectangular shape in the plan view. The die pad 3 is located at the center of the semiconductor device A1 in the plan view. The die pad 3 is made of, for example, copper or a copper alloy.

As shown in FIGS. 10 to 12, the die pad 3 has a die pad main surface 30a. Further, the die pad 3 includes a first portion 31, a second portion 32, a third portion 33, and a fourth portion 34, as shown in FIGS. 6, 7, and 10 to 12.

As shown in FIGS. 10 to 12, the die pad main surface 30a faces one side (upper side) in the thickness direction z. That is, the die pad main surface 30a faces the same side as the element main surface 10a. The semiconductor element 1 is mounted on the die pad main surface 30a, which faces the element back surface 10b. As can be seen from FIGS. 6 and 10 to 12, the die pad main surface 30a spans the first portion 31, the second portion 32, the third portion 33, and the fourth portion 34. The die pad main surface 30a includes an upper surface of the first portion 31, an upper surface of the second portion 32, an upper surface of the third portion 33, and an upper surface of the fourth portion 34. In the die pad main surface 30a, for example, a process of plating a Ni layer and an Ag layer in the named order is performed on a base. However, this plating process may not be performed, or may be performed with other conductive materials.

Figure 7:
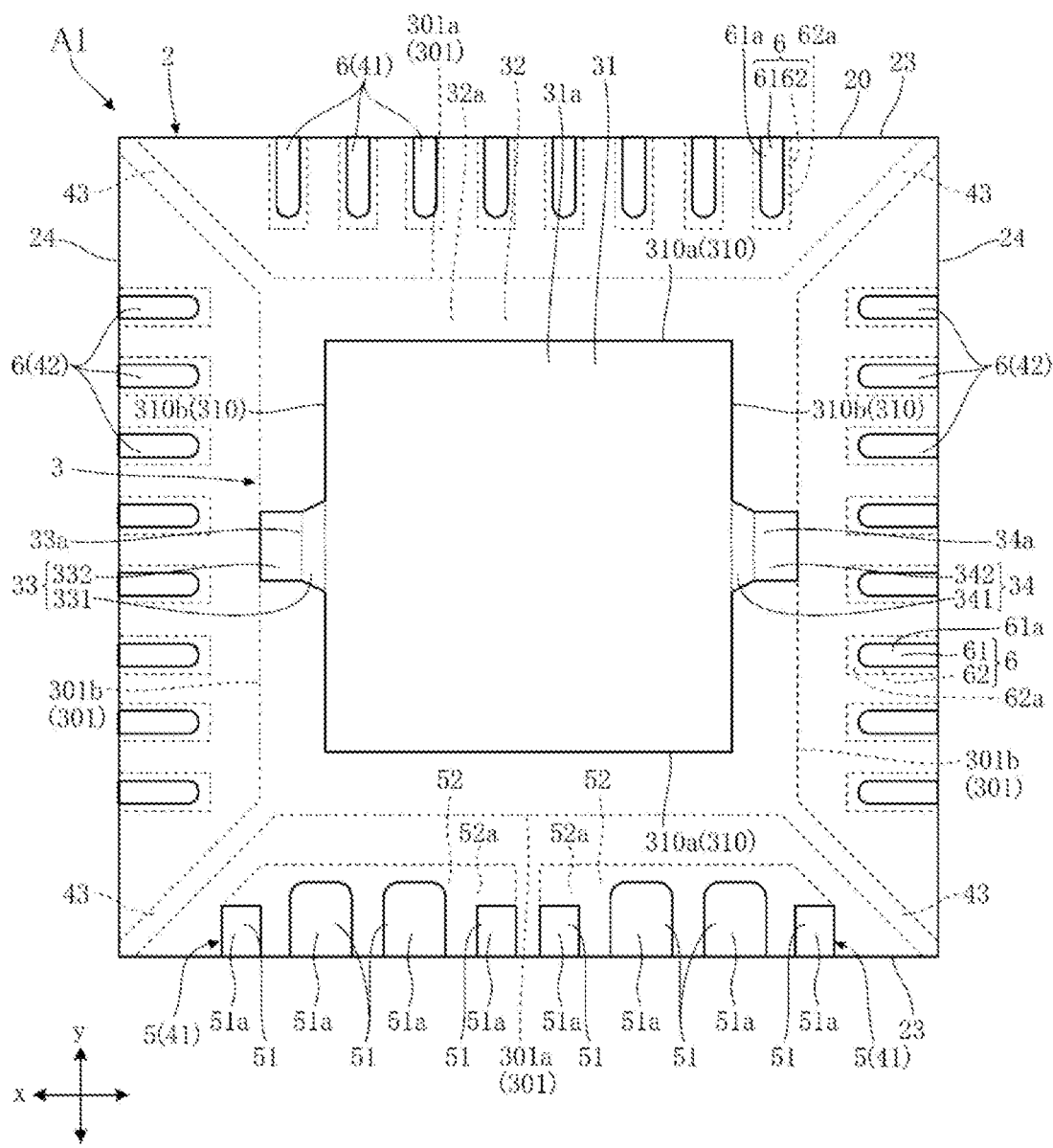
FIG. 7 is a bottom view showing the semiconductor device according to the first embodiment of the present disclosure.
Figure 8:
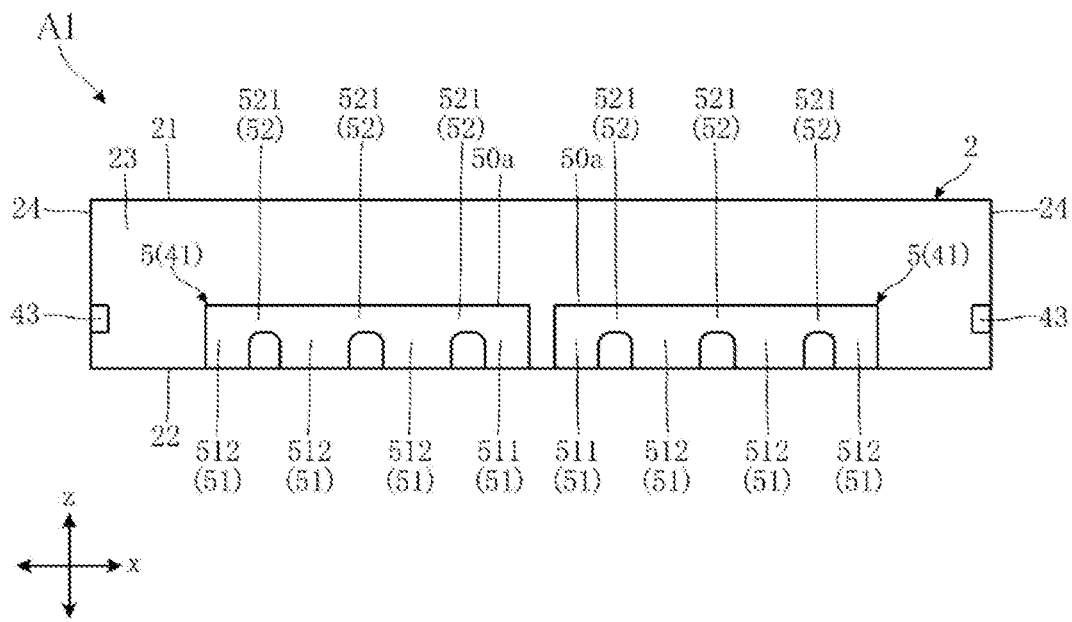
FIG. 8 is a front view showing a semiconductor device according to the first embodiment of the present disclosure.
Figure 9:
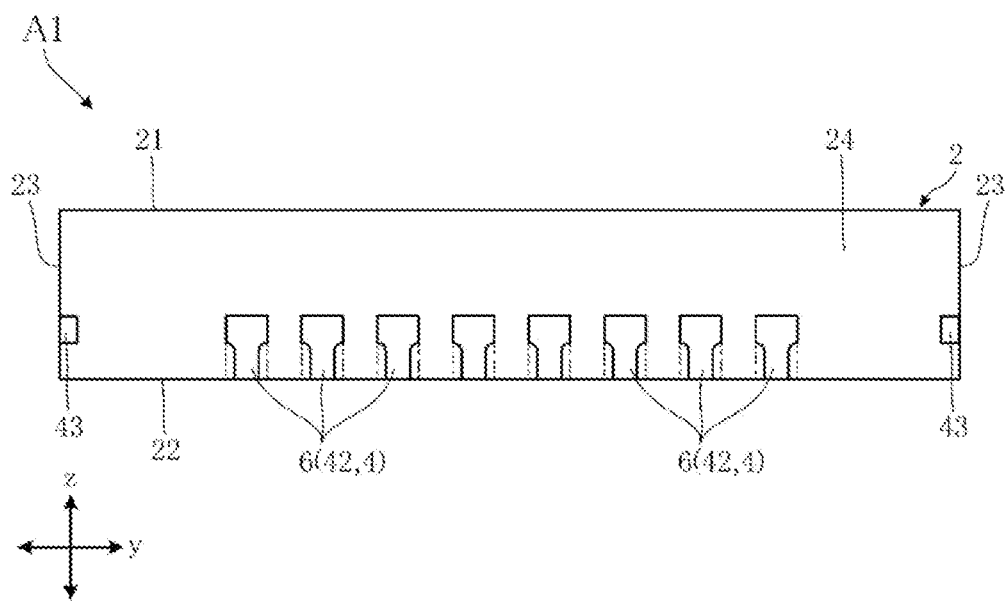
FIG. 9 is a side view (right side view) showing a semiconductor device according to the first embodiment of the present disclosure.

As shown in FIGS. 6 and 7, the outer edge 301 of the die pad main surface 30a in the plan view has a pair of end edges 301a and a pair of end edges 301b. The pair of end edges 301a are spaced apart from each other in the first direction y and are substantially parallel to each other. Each of the pair of end edges 301a extends in the second direction x. The pair of end edges 301b are spaced apart from each other in the second direction x and are substantially parallel to each other. Each of the pair of end edges 301b extends in the first direction y.

As shown in FIGS. 6 and 10, the die pad main surface 30a includes a pair of openings 302. One of the pair of openings 302 (the opening 302 on one side in the second direction x) is formed, for example, to overlap with a boundary between the first portion 31 and the third portion 33 in the plan view. The opening 302 may not be formed to overlap with the boundary between the first portion 31 and the third portion 33, but may be out of alignment from this boundary to the side of the first portion 31 or the side of the third portion 33 in the second direction x. The other side of the pair of openings 302 (the opening 302 on the other side in the second direction x) is formed, for example, to overlap with a boundary between the first portion 31 and the fourth portion 34 in the plan view. The opening 302 may not be formed to overlap with a boundary between the first portion 31 and the fourth portion 34, but may be out of alignment from this boundary to the side of the first portion 31 or the side of the fourth portion 34 in the second direction x. In the example shown in FIG. 6 and the like, each opening 302 is formed in a linear shape extending in the first direction y in the plan view. Unlike this example, a plurality of dot-shaped openings 302 may be arranged along the first direction y at each of the boundary between the first portion 31 and the third portion 33 and the boundary between the first portion 31 and the fourth portion 34.

The first portion 31 is a portion where the semiconductor element 1 is mounted. As shown in FIGS. 3 and 6, the first portion 31 overlaps with the semiconductor element 1 in the plan view. The first portion 31 has a rectangular shape in the plan view. The first portion 31 is located at the center of the die pad 3 in the plan view. The first portion 31 has a back surface 31a in the plan view, as shown in FIGS. 7 and 10 to 12. The back surface 31a faces the side opposite to the die pad main surface 30a in the thickness direction z. As shown in FIGS. 10 to 12, the back surface 31a is flush with the resin back surface 22 and is exposed from the resin member 2 (resin back surface 22). The first portion 31 has a rectangular shape in the plan view. The dimension of the first portion 31 in the thickness direction z, i.e., a distance from the die pad main surface 30a to the back surface 31a along the thickness direction z is, for example, 0.15 mm or more and 0.25 mm or less. The back surface 31a corresponds to the "first back surface" recited in the claims As shown in FIGS. 6 and 7, an outer edge 310 of the first portion 31 in the plan view includes a pair of end edges 310a and a pair of end edges 310b. The pair of end edges 310a are spaced apart from each other in the first direction y and are substantially parallel to each other. Each of the pair of end edges 310a extends in the second direction x. The pair of end edges 310a are parallel to the pair of end edges 301a (die pad main surface 30a). The pair of end edges 310b are spaced apart from each other in the second direction x and are substantially parallel to each other. Each of the pair of end edges 310b extends in the first direction y. The pair of end edges 310b are parallel to the pair of end edges 301b (die pad main surface 30a).

As shown in FIGS. 6 and 7, the second portion 32 is arranged around the first portion 31 in the plan view and is connected to the outer edge 310 of the first portion 31. As shown in FIGS. 11 and 12, the second portion 32 has a back surface 32a. The back surface 32a faces the side opposite to the die pad main surface 30a. As shown in FIGS. 11 and 12, the back surface 32a is located closer to the die pad main surface 30a than the back surface 31a in the thickness direction z. Further, the back surface 32a is covered with the resin member 2. Since the back surface 32a of the second portion 32 is covered with the resin member 2, the die pad 3 is suppressed from being removed from the resin member 2. The second portion 32 is a portion thinned from the other side (lower side) of the die pad 3 in the thickness direction z. This thinning is performed by, for example, etching (half etching), but may be performed by press working. The thickness (dimension in the thickness direction z) of the second portion 32 is, for example, about half of the thickness (dimension in the thickness direction z) of the first portion 31. The dimension of the second portion 32 in the thickness direction z, i.e., a distance from the die pad main surface 30a to the back surface 32a along the thickness direction z is, for example, 0.075 mm or more and 0.125 mm or less. The back surface 32a corresponds to the "second back surface" recited in the claims As shown in FIGS. 6 and 7, each of the third portion 33 and the fourth portion 34 is arranged around the first portion 31 in the plan view and extends from the outer edge 310 of the first portion 31. The third portion 33 and the fourth portion 34 are arranged around the first portion 31 such that, for example, as shown in FIG. 6, a line segment L1 connecting the center of the third portion 33 in the plan view and the center of the fourth portion 34 in the plan view overlaps with the semiconductor element 1. The line segment L1 may overlap with the center of the semiconductor element 1 in the plan view.

The third portion 33 extends from one of the pair of end edges 310b of the first portion 31 and extends to one of the pair of end edges 301b of the die pad main surface 30a. In the illustrated example, the third portion 33 is connected to the central portion of one of the pair of end edges 310b in the first direction y. As shown in FIG. 10, the third portion 33 has a back surface 33a. The back surface 33a faces the side opposite to the die pad main surface 30a. As shown in FIG. 10, the back surface 33a is flush with the back surface 31a in the thickness direction z. Further, the back surface 33a is flush with the resin back surface 22 and is exposed from the resin member 2 (resin back surface 22). The dimension of the third portion 33 in the thickness direction z, i.e., the distance from the die pad main surface 30a to the back surface 33a along the thickness direction z, is the same as the dimension of the first portion 31 in the thickness direction z. The back surface 33a corresponds to the "third back surface" recited in the claims The fourth portion 34 extends from the other of the pair of end edges 310b of the first portion 31 and extends to the other of the pair of end edges 301b of the die pad main surface 30a. In the illustrated example, the fourth portion 34 is connected to the central portion of the other of the pair of end edges 310b in the first direction y. As shown in FIG. 10, the fourth portion 34 has a back surface 34a. The back surface 34a faces the side opposite to the die pad main surface 30a. As shown in FIG. 10, the back surface 34a is flush with the back surface 31a in the thickness direction z. Further, the back surface 34a is flush with the resin back surface 22 and is exposed from the resin member 2 (resin back surface 22). The dimension of the fourth portion 34 in the thickness direction z, i.e., the distance from the die pad main surface 30a to the back surface 34a along the thickness direction z, is the same as the dimension of the first portion 31 in the thickness direction z and the thickness of the third portion 33 in the thickness direction z. The back surface 34a corresponds to the "fourth back surface" recited in the claims As shown in FIGS. 6 and 7, the third portion 33 includes a tapered portion 331 and a band-shaped portion 332, and the fourth portion 34 includes a tapered portion 341 and a band-shaped portion 342. The tapered portions 331 and 341 are connected to the outer edge 310 (the pair of end edges 310b) of the first portion 31. The band-shaped portions 332 and 342 extend from the tapered portions 331 and 341 to the outer edge 301 (the pair of end edges 301b) of the die pad main surface 30a. The band-shaped portions 332 and 342 have, for example, a rectangular shape in the plan view. In the example in which the third portion 33 and the fourth portion 34 extend from the pair of end edges 310b in the plan view, both ends of each opening 302 in the first direction y overlap with the band-shaped portions 332 and 342 when viewed in the second direction x. A length d302 (see FIG. 6) of each opening 302 in the plan view is, for example, 0.3 mm or more and 4.0 mm or less. The length d302 is the dimension of each opening 302 in the direction (first direction y) in which the pair of end edges 310a extends. The length d302 is, for example, equal to or less than the width of each of the band-shaped portions 332 and 342 (the dimension of each of the band-shaped portions 332 and 342 in the direction in which the pair of end edges 310a extends). The width of the tapered portions 331 and 341 becomes narrower in the plan view from the pair of end edges 310a toward the band-shaped portions 332 and 342. The width in the semiconductor device A1 is the dimension along the first direction y. Unlike the example shown in FIGS. 6 and 7, the third portion 33 may not include the tapered portion 331 and may include the band-shaped portion 332. In this case, in the plan view, the band-shaped portion 332 extends from the outer edge 310 (one of the pair of end edges 310b) of the first portion 31 to the outer edge 301 (one of the pair of end edges 301b) of the die pad main surface 30a. Similarly, the fourth portion 34 may include the band-shaped portion 342 without including the tapered portion 341. In this case, in the plan view, the band-shaped portion 342 extends from the outer edge 310 of the first portion 31 (the other of the pair of end edges 310b) to the outer edge 301 of the die pad main surface 30a (the other of the pair of end edges 301b).

The die pad 3 includes a plurality of recesses 35. As shown in FIG. 10, each recess 35 is recessed from the die pad main surface 30a in the thickness direction z. As shown in FIG. 10, each recess 35 includes any of a pair of openings 302 and extends from any of the pair of openings 302 to the other (lower) side in the thickness direction z. The plurality of recesses 35 and the pair of openings 302 are respectively formed by, for example, etching. These may be formed by press working called stamping or may be formed by laser machining, instead of etching. For example, when formed by stamping, each recess 35 may be a V-shaped recess instead of the U-shaped recess shown in FIG. 10.

The die pad 3 is formed with a pair of clamp marks 39. Each of the pair of clamp marks 39 is recessed in the thickness direction z from the die pad main surface 30a. Each clamp mark 39 is a pressing mark formed by a clamp member described later and exhibits a scratch-like shape slightly recessed from the die pad main surface 30a. One pair of clamp marks 39 is formed on each of the third portion 33 and the fourth portion 34. For example, the pair of clamp marks 39 are formed at the center of the third portion 33 in the plan view and the center of the fourth portion 34 in the plan view, respectively. The clamp marks 39 may not be formed on the die pad 3.

As shown in FIGS. 1 and 2, each of the plurality of leads 4 entirely overlaps with the resin member 2 when viewed in the thickness direction z. As shown in FIG. 2, the plurality of leads 4 are arranged along the outer edge 20 of the resin member 2 when viewed in the thickness direction z. As shown in FIG. 1, each of the plurality of leads 4 is exposed from the resin back surface 22. Each of the plurality of leads 4 is made of, for example, copper or a copper alloy. The die pad 3 and the plurality of leads 4 are formed from, for example, one lead frame. In the semiconductor device A1, the plurality of leads 4 include a plurality of first side leads 41 and a plurality of second side leads 42, as shown in FIGS. 1 and 2.

As shown in FIGS. 1 to 3, 6, and 7, the plurality of first side leads 41 are arranged to sandwich the die pad 3 in the first direction y. The plurality of first side leads 41 include first side leads arranged on one side (the upper side in FIGS. 2 and 3) in the first direction y with respect to the die pad 3 and first side leads arranged on the other side (the lower side in FIGS. 2 and 3) in the first direction y with respect to the die pad 3. The plurality of first side leads 41 are arranged along the second direction x on both sides of the die pad 3 in the first direction y. Each of the plurality of first side leads 41 is exposed from any of the pair of first resin side surfaces 23. The plurality of first side leads 41 includes first side leads exposed from one of the first resin side surfaces 23 and first side leads exposed from the other of the first resin side surfaces 23. A part of each of the plurality of first side leads 41 is exposed from the resin back surface 22.

As shown in FIGS. 1 to 3, 6, and 7, the plurality of second side leads 42 are arranged to sandwich the die pad 3 in the second direction x. The plurality of second side leads 42 include second side leads arranged on one side (the right side in FIGS. 2 and 3) in the second direction x with respect to the die pad 3 and second side leads arranged on the other side (the left side in FIGS. 2 and 3) in the second direction x with respect to the die pad 3. The plurality of second side leads 42 are arranged along the first direction y on both sides of the die pad 3 in the second direction x. Each of the plurality of second side leads 42 is exposed from any of the pair of second resin side surfaces 24. The plurality of second side leads 42 includes second side leads exposed from one of the second resin side surfaces 24 and second side leads exposed from the other of the second resin side surfaces 24. A part of each of the plurality of second side leads 42 is exposed from the resin back surface 22.

The plurality of leads 4 (the plurality of first side leads 41 and the plurality of second side leads 42) include first leads 5 and second leads 6. In the semiconductor device A1, as shown in FIGS. 3 and 6, the plurality of first side leads 41 include two first leads 5 and a plurality of second leads 6, and the plurality of second side leads 42 include a plurality of second leads 6.

Figure 4:
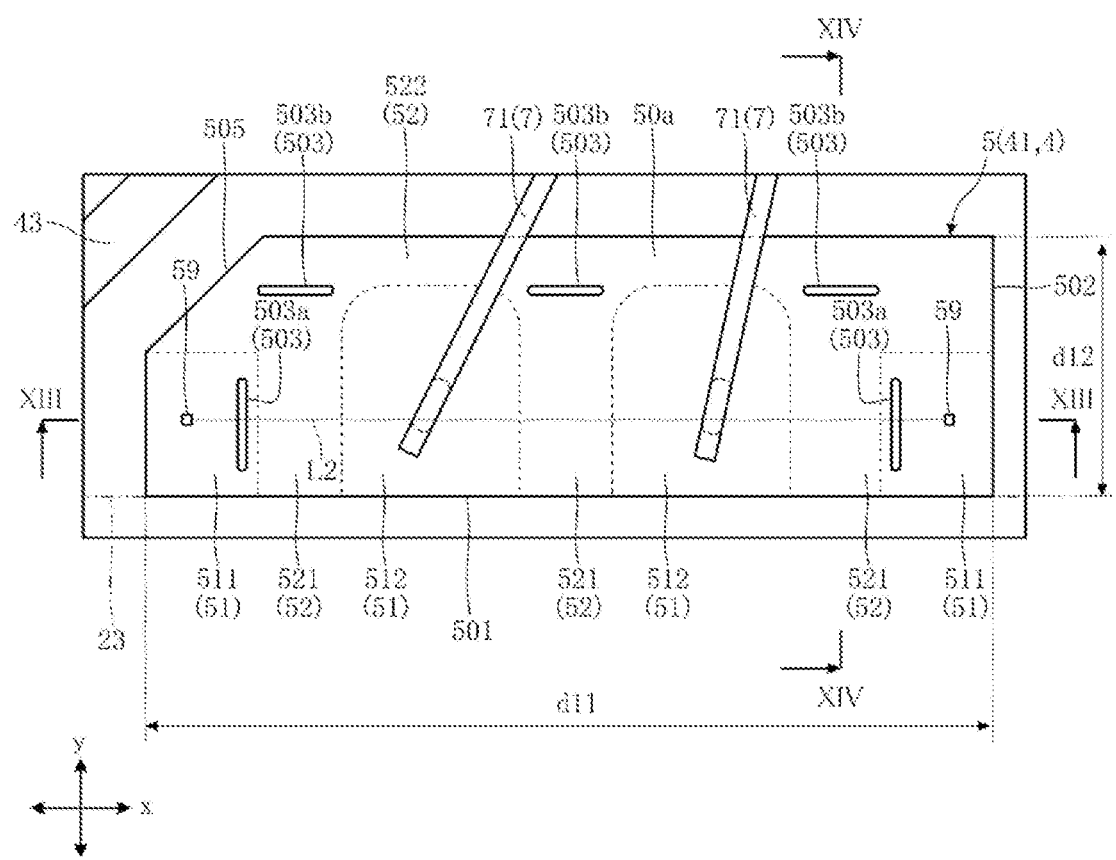
FIG. 4 is an enlarged view of a part (first lead) in FIG. 3.
Figure 13:
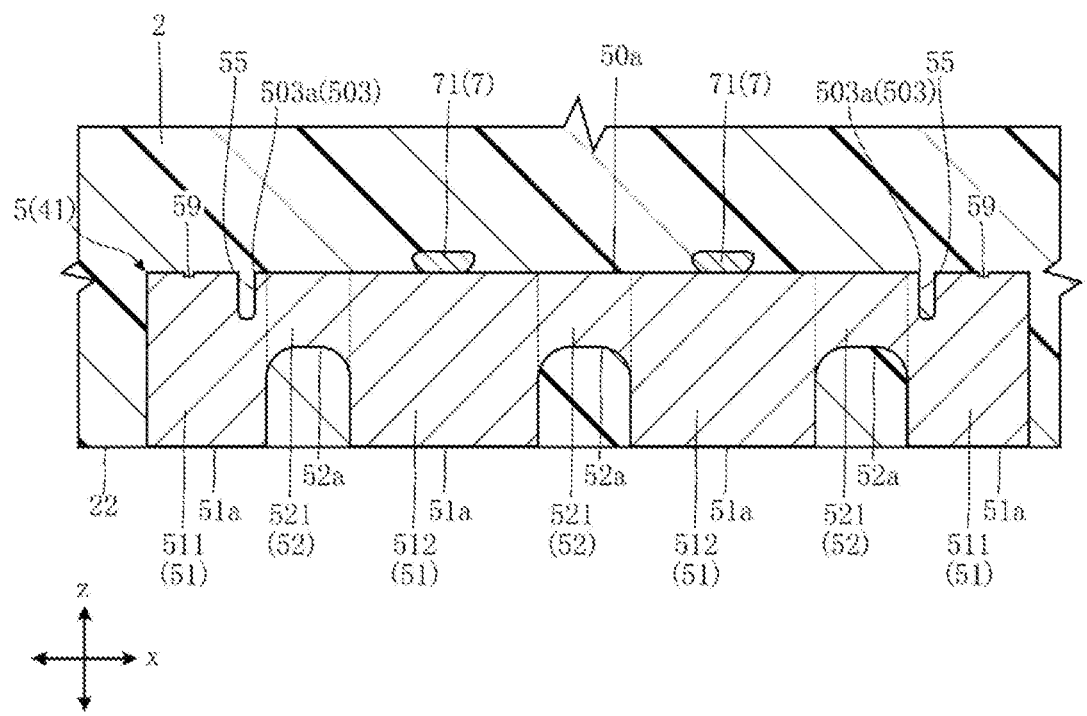
FIG. 13 is a cross-sectional view taken along line XIII-XIII in FIG. 4.

As shown in FIGS. 2 to 4 and 11, each first lead 5 is electrically connected to the first main surface electrode 12 of the semiconductor element 1 via the connecting member 7 (first connecting member 71). As shown in FIG. 3, in the semiconductor device A1, each first lead 5 is arranged closer to the power component 101 than the control circuit component 102 in the first direction y. As shown in FIGS. 4, 11 and 13, each first lead 5 has a first pad surface 50a and includes a plurality of first portions 51 and a plurality of second portions 52.

In each first lead 5, the first pad surface 50a faces one side (upper side) in the thickness direction z and faces the same side as the element main surface 10a, as shown in FIG. 11. The connecting member 7 (first connecting member 71) is bonded to the first pad surface 50a. The first pad surface 50a spans the plurality of first portions 51 and the plurality of second portions 52. The first pad surface 50a includes upper surfaces of the first portions 51 and the second portions 52. The first pad surface 50a is formed by, for example, plating Ni on a base, but the plating may not be performed. The first pad surface 50a has an end edge 501 and an end edge 502, as shown in FIG. 4.

As shown in FIG. 4, the end edge 501 overlaps with the outer edge 20 (first resin side surface 23) of the resin member 2 when viewed in the thickness direction z. The direction in which the end edge 501 extends is referred to as a "first width direction." In each of the first leads 5 included in the plurality of first side leads 41, the first width direction coincides with the second direction x. When the first leads 5 are included in the plurality of second side leads 42, in the first leads 5 of the second side leads 42, the first width direction coincides with the first direction y.

As shown in FIG. 4, the end edge 502 extends from the edge 501 toward the die pad 3 while being orthogonal to the end edge 501 when viewed in the thickness direction z. The direction in which the end edge 502 extends is referred to as a "first length direction." In each of the first leads 5 included in the plurality of first side leads 41, the first length direction coincides with the first direction y. When the first leads 5 are included in the plurality of second side leads 42, the first length direction of the first leads 5 of the second side leads 42 coincides with the second direction x.

In the semiconductor device A1, as shown in FIG. 4, the end edge 501 is longer than the end edge 502 on the first pad surface 50a of each first lead 5. The length d11 of the end edge 501 is, for example, 0.75 mm or more and 2.0 mm or less, and the length d12 of the end edge 502 is, for example, 0.3 mm or more and 1.2 mm or less. The length d11 of the end edge 501 and the length d12 of the end edge 502 are not limited to these values and may be appropriately changed according to the number of connecting members 7 (first connecting members 71) to be bonded to each first lead 5.

The first pad surface 50a includes a plurality of openings 503, as shown in FIGS. 3, 4 and 6. In the example shown in FIG. 4 and the like, each of the plurality of openings 503 is formed in a linear shape in the plan view. Unlike this configuration, instead of the linear opening 503, a configuration in which a plurality of dot-shaped openings 503 are linearly arranged may be used. As shown in FIG. 4, the plurality of openings 503 includes a pair of first openings 503a and a plurality of second openings 503b.

As shown in FIG. 4, the pair of first openings 503a among the plurality of openings 503 are located on the outermost side on one side and the other side in the first width direction (second direction x in the present embodiment). The pair of first openings 503a have a linear shape in the plan view and extend in the first length direction (the first direction y in the present embodiment). The plurality of second openings 503b are located between the pair of first openings 503a in the first width direction (the second direction x in the present embodiment). The plurality of second openings 503b have a linear shape in the plan view and extend in the first width direction (the second direction x in the present embodiment).

In each first lead 5, the plurality of first portions 51 are arranged in the first width direction. As shown in FIGS. 7 and 13, each of the plurality of first portions 51 has a back surface 51a. The back surface 51a faces the side opposite to the first pad surface 50a. The back surface 51a is flush with the resin back surface 22 and is exposed from the resin member 2 (resin back surface 22). The dimension of each first portion 51 in the thickness direction z, i.e., a distance from the first pad surface 50a to the back surface 51a along the thickness direction z, is, for example, 0.15 mm or more and 0.25 mm or less. In the example in which the die pad 3 and the plurality of leads 4 are formed from one lead frame, the thickness of each first portion 51 (dimension in the thickness direction z) may be equal to the thickness of the first portion 31 (in the thickness direction z).

In each first lead 5, the plurality of first portions 51 includes a pair of outer portions 511 and one or more inner portions 512 (two inner portions 512 in the semiconductor device A1), as shown in FIG. 4. The pair of outer portions 511 are located at both ends in the first width direction (second direction x in the present embodiment). The inner portions 512 are interposed between the pair of outer portions 511 in the first width direction. The connecting member 7 (first connecting member 71) is bonded to the inner portions 512. In the plan view, an area of each inner portion 512 is larger than the area of each of the pair of outer portions 511. A width of each inner portion 512 (a dimension along the first width direction, i.e., a dimension in the second direction x in the present embodiment) is, for example, equal to or larger than a wire diameter (diameter) of the first connecting member 71 described later and is 1.0 mm or less. By making the width of each inner portion 512 equal to or larger than the wire diameter of the first connecting member 71, it is possible to prevent a bonding portion of the first connecting member 71 from protruding from the inner portions 512 in the plan view, which makes it possible to suppress the first connecting member 71 from wobbling. On the other hand, by setting the width of each inner portion 512 to 1.0 mm or less, it is possible to suppress reduction in a size of the second portion 52 and prevent the first leads 5 from being removed from the resin member 2. In some embodiments, the width of each inner portion 512 is about twice the wire diameter of the first connecting member 71.

As shown in FIG. 4, in the semiconductor device A1, each of the pair of first openings 503a is formed on the first pad surface 50a in each of the pair of outer portions 511. Each first opening 503a is formed on the side of each outer portion 511 closer to the inner portion 512 in the first width direction (second direction x). Each first opening 503a may be formed at a boundary between the outer portion 511 and the second portion 52 (for example, the connecting portion 521 described later) in the plan view.

In each first lead 5, the second portion 52 is connected to each of the plurality of first portions 51. As shown in FIG. 13, the second portion 52 is recessed from the back surface side of the first lead 5 and is thinner than the first portion 51. The second portion 52 is a portion thinned from the other side (lower side) of each first lead 5 in the thickness direction z. This thinning is performed by, for example, etching (half etching), but may be performed by press working. The second portion 52 has a back surface 52a. The back surface 52a faces the side opposite to the first pad surface 50a. The back surface 52a is a surface substantially parallel to the first pad surface 50a. The back surface 52a is located closer to the first pad surface 50a than the back surface 51a in the thickness direction z. The back surface 52a is covered with the resin member 2. Since the back surface 52a of the second portion 52 is covered with the resin member 2, removal of each first lead 5 from the resin member 2 is suppressed. The dimension of each second portion 52 in the thickness direction z, i.e., the distance from the first pad surface 50a to the back surface 52a along the thickness direction z, is, for example, 0.075 mm or more and 0.125 mm or less. In the example in which the die pad 3 and the plurality of leads 4 are formed from one lead frame, when the thickness of each first portion 51 is equal to the thickness of the first portion 31, the thickness of each second portion 52 (the dimension in the thickness direction z) may be about half of the thickness of each first portion 51.

In each first lead 5, the second portion 52 includes a plurality of connecting portions 521 and a connecting portion 522, as shown in FIG. 4. Each of the plurality of connecting portions 521 is connected to and interposed between two adjacent first portions of the plurality of first portions 51 in the first width direction (the second direction x in the present embodiment). In the semiconductor device A1, as shown in FIG. 4, the plurality of connecting portions 521 are respectively located between one outer portion 511 and the inner portion 512 adjacent thereto, between the two inner portions 512, and between the other outer portion 511 and the inner portion 512 adjacent thereto. The connecting portion 522 is connected to the plurality of connecting portions 521. The connecting portion 522 has a band-shape in the plan view and extends in the first width direction. The connecting portion 522 is located closer to the die pad 3 than the plurality of connecting portions 521 in the first length direction (the first direction y in the present embodiment). The second portion 52 may not include the connecting portion 522 and may include the plurality of connecting portions 521.

As shown in FIG. 4, in the semiconductor device A1, each of the plurality of second openings 503b described above is formed on the first pad surface 50a of the second portion 52. In the example shown in FIG. 4, for example, each second opening 503b is formed to overlap with a boundary between each connecting portion 521 and the connecting portion 522 in the plan view. Unlike this example, each second opening 503b may be out of alignment to one side in the first length direction (first direction y) from the boundary between each connecting portion 521 and the connecting portion 522 in the plan view.

Figure 14:
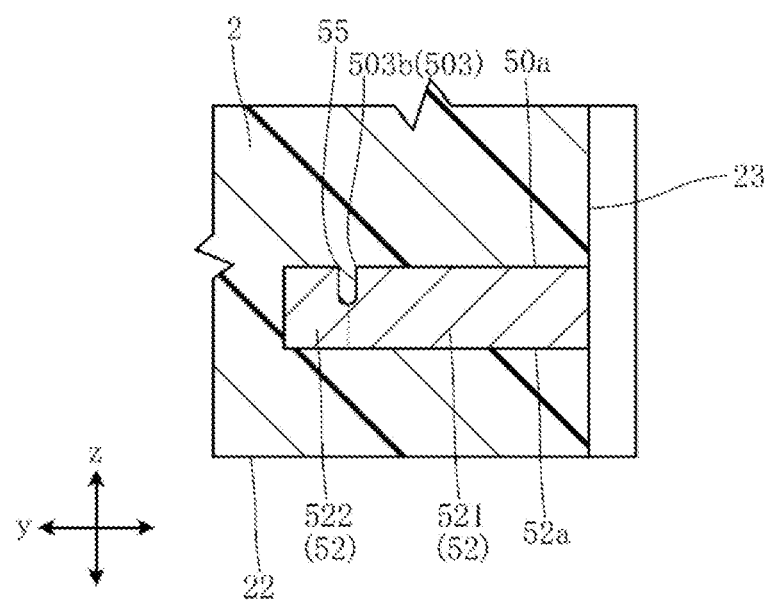
FIG. 14 is a cross-sectional view taken along line XIV-XIV in FIG. 4.

Each first lead 5 includes a plurality of recesses 55. As shown in FIGS. 13 and 14, each of the plurality of recesses 55 is recessed in the thickness direction z from the first pad surface 50a. As shown in FIGS. 13 and 14, each of the plurality of recesses 55 includes any one of a plurality of openings 503 (a plurality of first openings 503a and a plurality of second openings 503*b*) and extends from each opening 503 in the thickness direction z. The plurality of recesses 55 and the plurality of openings 503 are formed by, for example, etching. These may be formed by press working called stamping or may be formed by laser machining, instead of etching. For example, when formed by stamping, each recess 55 may be a V-shaped recess instead of the U-shaped recess shown in FIGS. 13 and 14.

In the semiconductor device A1, each first lead 5 is formed with a notch 505 as shown in FIG. 4. In the plan view, the notch 505 is formed along the adjacent third lead 43 and is substantially parallel to the adjacent third lead 43.

Each first lead 5 is formed with a pair of clamp marks 59. Each of the pair of clamp marks 59 is recessed in the thickness direction z from the first pad surface 50*a*. Each clamp mark 59 is a pressing mark formed by a clamp member described later and exhibits a scratch-like shape slightly recessed from the first pad surface 50*a*. One pair of clamp marks 59 is formed on each of one pair of outer portions 511. In some embodiments, as shown in FIG. 4, in each first lead 5, the bonding portion of each first connecting member 71 overlaps with a line segment L2 connecting the pair of clamp marks 59 in the plan view. The clamp marks 59 may not be formed on each first lead 5.

Figure 15:
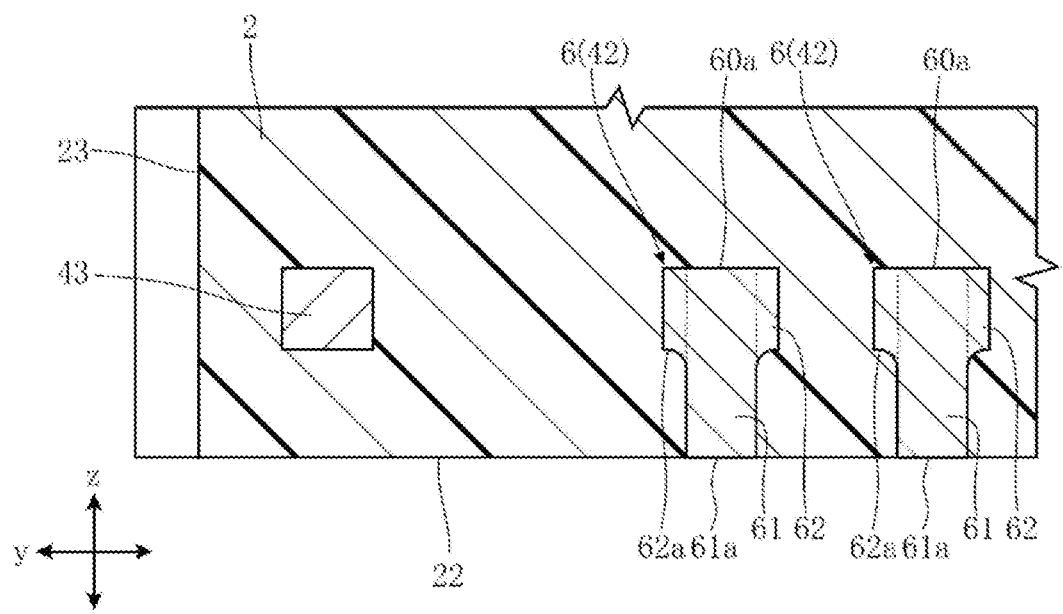
FIG. 15 is a cross-sectional view taken along line XV-XV in FIG. 5.

The second lead 6 is electrically connected to the second main surface electrode 13 of the semiconductor element 1 via the connecting member 7 (second connecting member 72). As shown in FIGS. 5, 11, and 15, each second lead 6 has a second pad surface 60*a* and includes a first portion 61 and a second portion 62.

In each second lead 6, the second pad surface 60*a* faces the same side as the first pad surface 50*a*. Therefore, the second pad surface 60*a* faces one side (upper side) in the thickness direction z. The connecting member 7 (second connecting member 72) is bonded to the second pad surface 60*a*. The second pad surface 60*a* is subjected to, for example, a process of plating a base with a Ni layer and an Ag layer in the named order, but such a process of plating may not be performed or a process of plating with other conductive materials may be performed. The second pad surface 60*a* has an end edge 601 and an end edge 602, as shown in FIG. 5.

The end edge 601 overlaps with the outer edge 20 of the resin member 2 when viewed in the thickness direction z. The direction in which the end edge 601 extends is referred to as a "second width direction." In each of the second leads 6 of the plurality of first side leads 41, the second width direction coincides with the second direction x, and in each of the second leads 6 of the plurality of second side leads 42, the second width direction coincides with the first direction y.

The end edge 602 extends from the end edge 601 toward the die pad 3 while being orthogonal to the end edge 601 when viewed in the thickness direction z. The direction in which the end edge 602 extends is referred to as a "second length direction." In each of the second leads 6 of the plurality of first side leads 41, the second length direction coincides with the first direction y, and in each of the second leads 6 of the plurality of second side leads 42, the second length direction coincides with the second direction x. As shown in FIG. 5, the end edge 601 is shorter than the end edge 602. A length d21 of the end edge 601 is, for example, 0.15 mm or more and 0.3 mm or less, and a length d22 of the end edge 602 is, for example, 0.5 mm or more and 1.0 mm or less.

In each second lead 6, the connecting member 7 (second connecting member 72) is bonded to the first portion 61 as shown in FIGS. 5 and 11. As shown in FIG. 11, the first portion 61 has a back surface 61*a*. The back surface 61*a* faces the side opposite to the second pad surface 60*a*. The back surface 61*a* is flush with the resin back surface 22 and is exposed from the resin member 2 (resin back surface 22). The area of the back surface 61*a* is smaller than the area of the back surface 51*a* of each inner portion 512 of the first lead 5. The dimension of the first portion 61 in the thickness direction z, i.e., the distance from the second pad surface 60*a* to the back surface 61*a* along the thickness direction z, is, for example, 0.15 mm or more and 0.25 mm or less. In the example in which the die pad 3 and the plurality of leads 4 are formed from one lead frame, the thickness of each first portion 61 (the dimension in the thickness direction z) may be equal to the thickness of the first portion 31.

In each second lead 6, the second portion 62 is connected to the first portion 61, as shown in FIGS. 5 and 11. As shown in FIG. 11, the second portion 62 is recessed from the back surface side of the second lead 6 and is thinner than the first portion 61. The second portion 62 is a portion of each second lead 6 thinned from the other side (lower side) in the thickness direction z. This thinning is performed by, for example, etching (half etching), but may be performed by press working. As shown in FIG. 11, the second portion 62 has a back surface 62*a*. The back surface 62*a* faces the side opposite to the second pad surface 60*a*. The back surface 62*a* is a surface substantially parallel to the second pad surface 60*a*. The back surface 62*a* is located closer to the second pad surface 60*a* than the back surface 61*a* in the thickness direction z. The back surface 62*a* is covered with the resin member 2. Since the back surface 62*a* of the second portion 62 is covered with the resin member 2, removal of each second lead 6 from the resin member 2 is suppressed. The dimension of the second portion 62 in the thickness direction z, i.e., the distance from the second pad surface 60*a* to the back surface 62*a* along the thickness direction z, is, for example, 0.075 mm or more and 0.125 mm or less. In the example in which the die pad 3 and the plurality of leads 4 are formed from one reed frame, when the thickness of the first portion 61 is equal to the thickness of the first portion 31, the thickness of the second portion 62 (the dimension in the thickness direction z) may be about half of the thickness of the first portion 61.

As shown in FIGS. 3 and 6, the area of the first pad surface 50*a* is larger than the area of the second pad surface 60*a*. In the present embodiment, the length d12 of the end edge 502 is substantially equal to the length d22 of the end edge 602, and the length d11 of the end edge 501 is larger than the length d21 of the end edge 601. For example, the length d11 of the end edge 501 is 3 times or more and 20 times or less larger than the length d21 of the end edge 601.

As shown in FIGS. 2, 3, 6, and 7, the plurality of third leads 43 extend from the outer edge of the die pad 3 (outer edge 301 of the die pad main surface 30*a*) toward the outer edge 20 of the resin member 2 in the plan view. In the semiconductor device A1, each of the plurality of third leads 43 extend from the four corners of the die pad 3 and extends toward the four corners of the resin member 2 in the plan view. Each of the plurality of third leads 43 is integrally formed with the die pad 3. Each of the plurality of third leads 43 has a smaller dimension in the thickness direction z than the die pad 3. Both sides of each of the plurality of third leads 43 in the thickness direction z are covered with the resin member 2. Each of the plurality of third leads 43 is a so-called hanging lead. As shown in FIGS. 12 and 15, both sides of each of the plurality of third leads 43 in the thickness direction z are covered with the resin member 2. The upper surface of each third lead 43 (the surface facing one side in the thickness direction z) is flush with the die pad main surface 30*a*, and the lower surface of each third lead 43 (the surface facing the other side in the thickness direction z) is flush with the back surface 32*a* of the second portion 32. The end surface of each of the third leads 43 overlapping with the outer edge 20 (the pair of first resin side surfaces 23 and the pair of second resin side surfaces 24) of the resin member 2 in the plan view is exposed from the resin member 2. Each of the plurality of third leads 43 is made of, for example, copper or a copper alloy.

The plurality of connecting members 7 electrically connects two portions spaced apart from each other. Each of the plurality of connecting members 7 electrically connects any one of the plurality of main surface electrodes 11 and any one of the plurality of leads 4. The plurality of connecting members 7 include a plurality of first connecting members 71 and a plurality of second connecting members 72.

Each of the plurality of first connecting members 71 is, for example, a bonding wire, and contains aluminum or an aluminum alloy as a constituent material. Each of the plurality of first connecting members 71 is bonded to any one of the plurality of first main surface electrodes 12 and any one of the plurality of first leads 5 to electrically connect them. Each first connecting member 71 is bonded by, for example, wedge bonding. The material and bonding method of each first connecting member 71 are not limited to the above-mentioned examples. For example, the constituent material of each first portion 61 may include gold or a gold alloy, or copper or a copper alloy instead of aluminum or an aluminum alloy. Further, each first connecting member 71 may be bonded by ball bonding. In addition, each of the plurality of first connecting members 71 may be, for example, a bonding ribbon instead of the bonding wire.

Each of the plurality of second connecting members 72 is, for example, a bonding wire, and the constituent material thereof includes gold or a gold alloy, or copper or a copper alloy. Each of the plurality of second connecting members 72 is bonded to any one of the plurality of second main surface electrodes 13 and any one of the plurality of second leads 6 to electrically connect them. Each second connecting member 72 is bonded by, for example, ball bonding. The material and bonding method of each second connecting member 72 are not limited to the above-mentioned examples.

In the examples shown in FIGS. 2, 3, and 11, each of the plurality of first connecting members 71 has, for example, a larger wire diameter than each of the plurality of second connecting members 72. However, the present disclosure is not limited thereto.

In the semiconductor device A1, as described above, each first connecting member 71 is bonded by wedge bonding. In the wedge bonding, the first connecting member 71 and an object to be bonded are bonded by applying ultrasonic vibration while pressing the first connecting member 71 against the object to be bonded (the first main surface electrode 12 and the first lead 5). The object to be bonded is fixed with a clamp member to suppress fluctuation of the object to be bonded due to a pressing force and the ultrasonic vibration at this time. The clamp member has tip portions formed in the shape of a thin rod, and the object to be bonded is fixed by pressing the object to be bonded with the tip portions. In the present embodiment, each first connecting member 71 is bonded to the first main surface electrode 12 and the first lead 5. Therefore, the die pad 3 and the first lead 5 are fixed by the clamp member. At this time, by pressing the die pad 3 with the clamp member (the tip portions thereof), a pair of clamp marks 39 are formed by the pressing force of the clamp member. Further, by pressing the first lead 5 with the clamp member (the tip portions thereof), a pair of clamp marks 59 are formed by the pressing force of the clamp member. Even when the second connecting member 72 is bonded, ultrasonic vibration may be applied while pressing the second connecting member 72 against the object to be bonded (the main surface electrode 11 and the second lead 6). However, the pressing force and the ultrasonic vibration at that time are weaker than the pressing force and ultrasonic vibration when bonding the first connecting member 71. The clamp member may not be used when bonding the second connecting member 72. The bonding of each second connecting member 72 is performed after the bonding of each first connecting member 71.

The actions and effects of the semiconductor device A1 are as follows.

In the semiconductor device A1, the die pad 3 has the die pad main surface 30*a* and includes the first portion 31, the second portion 32, the third portion 33, and the fourth portion 34. The die pad main surface 30*a* spans the first portion 31, the second portion 32, the third portion 33, and the fourth portion 34. The back surface 31*a* of the first portion 31, the back surface 33*a* of the third portion 33, and the back surface 34*a* of the fourth portion 34 are flush with each other, and the back surface 32*a* of the second portion 32 is located on the side of the die pad main surface 30*a* in the thickness direction z from the back surface 31*a*. In this configuration, the second portion 32 is thinner than the first portion 31, and the third portion 33 and the fourth portion 34 have the same thickness as the first portion 31. When bonding the first connecting member 71, the die pad 3 (and the semiconductor element 1 mounted thereon) may be fixed by, for example, a clamp member. At this time, the clamp member presses a periphery of the first portion 31 on which the semiconductor element 1 is mounted. Unlike the semiconductor device A1, in a semiconductor device in which the die pad 3 does not include the third portion 33 and the fourth portion 34, the second portion 32 is arranged on the entire circumference of the first portion 31. In this case, the second portion 32 is pressed by the clamp member to fix the die pad 3. However, since the second portion 32 is thinner than the first portion 31, the die pad 3 may be deformed or cracked due to the pressing force of the clamp member. When the die pad 3 is deformed by the pressing force of the clamp member, the semiconductor element 1 mounted on the die pad 3 may be peeled off. Therefore, in the semiconductor device A1, the third portion 33 and the fourth portion 34 may be pressed with the clamp member by providing the third portion 33 and the fourth portion 34 having the same thickness as the first portion 31 around the first portion 31. Accordingly, the semiconductor device A1 may suppress deformation and cracking of the die pad 3, which is a package structure that may be used to achieve a high quality.

In the semiconductor device A1, when the first connecting member 71 is bonded to the first main surface electrode 12, the semiconductor element 1 is fixed by fixing the third portion 33 and the fourth portion 34 with the clamp member. Therefore, in the semiconductor device A1, the third portion 33 and the fourth portion 34 are arranged such that the first portion 31 is interposed therebetween in the second direction x. At this time, in the plan view, the line segment L1 connecting the center of the third portion 33 and the center of the fourth portion 34 overlaps with the semiconductor element 1. According to this configuration, when the die pad 3 is fixed by the clamp member, the semiconductor element 1 may be fixed in a stable posture. That is, the semiconductor device A1 has a package structure that may be used to appropriately fix the semiconductor element 1.

In the semiconductor device A1, the pair of openings 302 are formed on the die pad main surface 30a of the die pad 3. The pair of openings 302 are formed, for example, at a boundary between the first portion 31 and the third portion 33 and a boundary between the first portion 31 and the fourth portion 34. According to this configuration, it is possible to determine positions of the third portion 33 and the fourth portion 34, that is, regions where the clamping may be performed, with reference to the pair of openings 302. For example, in the example shown in FIG. 6, referring to the pair of openings 302, it may be determined that regions outside the openings 302 are positions of the third portion 33 and the fourth portion 34, that is, the regions where the clamping may be performed.

In the semiconductor device A1, the third portion 33 includes the tapered portion 331, and the opening 302 is formed at the boundary between the third portion 33 and the first portion 31. In the die pad 3, the opening 302 is a portion recessed from the die pad main surface 30a in the thickness direction z, and the second portion 32 is a portion recessed from the lower side in the thickness direction z. Therefore, in a case where a distance between the opening 302 and the second portion 32 close to the opening 302 is not appropriately secured in the plan view, a rigidity of the die pad 3 may decrease. Thus, in the semiconductor device A1, the third portion 33 includes the tapered portion 331, whereby it becomes possible to appropriately secure the distance between the opening 302 and the second portion 32 close to the opening 302, which makes it possible to suppress a decrease in the rigidity of the die pad 3. The same applies to the configuration in which the fourth portion 34 includes the tapered portion 341. That is, the semiconductor device A1 has a package structure that may be used to suppress the rigidity of the die pad 3 from decreasing in forming the pair of openings 302.

In the semiconductor device A1, the plurality of leads 4 include the first lead 5 and the second lead 6. The first lead 5 has the first pad surface 50a to which the first connecting member 71 is bonded, and the second lead 6 has a second pad surface 60a to which the second connecting member 72 is bonded. When viewed in the thickness direction z, the first pad surface 50a is larger than the second pad surface 60a. According to this configuration, it is possible to bond a larger number of first connecting members 71 to the first lead 5 or bond a connecting member 7 having a large wire diameter to the first lead 5. Therefore, it is possible to allow a large current to flow through the semiconductor element 1. Further, the first lead 5 is larger than the second lead 6 and, therefore, has good conductivity. Accordingly, the semiconductor device A1 has a package structure which may be used to improve the performance.

In the semiconductor device A1, the semiconductor element 1 includes the power component 101 and the control circuit component 102. The power component 101 often operates with a relatively larger current than the control circuit component 102. Therefore, in the semiconductor device A1, the first lead 5 may be installed at the plurality of leads 4, which is a package structure that may be used to mount such a semiconductor element 1.

In the semiconductor device A1, the first lead 5 is arranged at a position closer to the power component 101 than the control circuit component 102. According to this configuration, it is possible to shorten the distance between the first main surface electrode 12 of the semiconductor element 1 and the first lead 5, which is an arrangement that may be used to bond the first connecting member 71.

In the semiconductor device A1, the plurality of first side leads 41 include the first lead 5, and the plurality of second side leads 42 do not include the first lead 5. Further, each first connection member 71 is bonded to each first lead 5 and the semiconductor element 1 (each first main surface electrode 12) by wedge bonding. When the first connecting member 71 is wedge-bonded to the first lead 5 of the plurality of first side leads 41 and the semiconductor element 1 (first main surface electrode 12), for example, both ends of the die pad 3 in the second direction x are pressed by the clamp member. At this time, for example, the clamp member presses one end of the die pad 3 in the second direction x from one side in the second direction x with respect to the one end, and the clamp member presses the other end of the die pad 3 in the second direction x from the other side in the second direction x with respect to the other end. In the semiconductor device A1, one end of the die pad 3 in the second direction x is the third portion 33, and the other end of the die pad 3 in the second direction x is the fourth portion 34. With such a pressing method, it becomes difficult to connect the semiconductor element 1 and the plurality of second side leads 42 by the first connecting member 71 due to the arrangement of the clamp member. Therefore, in the semiconductor device A1, by adopting a configuration in which the plurality of second side leads 42 do not include the first lead 5, each first connecting member 71 may not be bonded to the plurality of second side leads 42. This makes it possible to suppress a difficulty in bonding the first connecting member 71 to the plurality of second side leads 42 as described above. In other words, the third portion 33 and the fourth portion 34 are arranged on the side where the plurality of second side leads 42 not including the first lead 5 are arranged, with respect to the first portion 31, to suppress the aforementioned difficulty.

In the semiconductor device A1, each of the first leads 5 faces the side opposite to the first pad surface 50a in the thickness direction z and has the plurality of first exposed surfaces exposed from the resin back surface 22. In the semiconductor device A1, the first exposed surface is the back surface 51a in each inner portion 512. Further, the second lead 6 has the second exposed surface facing the side opposite to the second pad surface 60a in the thickness direction z and exposed from the resin back surface 22. In the semiconductor device A1, the second exposed surface is the back surface 61a of the first portion 61. When viewed in the thickness direction z, the back surface 51a (each first exposed surface) of each inner portion 512 is larger than the back surface 61a (second exposed surface). According to this configuration, when the semiconductor device A1 is mounted on a circuit board of an electronic device or the like, a bonding area between the back surface 51a of each inner portion 512 of the first portion 51 and the circuit board is larger than a bonding area between the back surface 61a of the second lead 6 and the circuit board. Therefore, the conductivity of the semiconductor device A1 from the first lead 5 to the circuit board may be made better than the conductivity from the second lead 6 to the circuit board. Further, in the semiconductor device A1, as described above, the first pad surface 50a of the first lead 5 is larger than the second pad surface 60a of the second lead 6. Therefore, it is easy to make the back surface 51a of each inner portion 512 larger than each back surface 61a.

In the semiconductor device A1, the first lead 5 has the first pad surface 50a and includes the first portion 51 and the second portion 52. The first pad surface 50a spans the first portion 51 and the second portion 52. The back surface 52a of the second portion 52 is located closer to the first pad surface 50a than the back surface 51a of the first portion 51 in the thickness direction z. In this configuration, the second portion 52 is thinner than the first portion 51. Therefore, when the first connecting member 71 is bonded to the second portion 52, the first lead 5 may be deformed or cracked. This is because when the first connecting member 71 is bonded, the first connecting member 71 is pressed against the first lead 5, such that the pressing force is applied to the first lead 5 to generate a stress in the first lead 5. Further, when bonding the first connecting member 71, the first lead 5 may be pressed by the clamp member to fix the first lead 5. At this time, when the second portion 52 is pressed by the clamp member, the first lead 5 may be deformed or cracked due to the pressing force of the clamp member. When the first lead 5 is deformed by the pressing force of the clamp member, it may not be possible to secure an appropriate bonding strength when bonding the first connecting member 71. Therefore, in the semiconductor device A1, by forming the plurality of openings 503 on the first pad surface 50a, it is possible to determine the position of the first portion 51 with reference to the plurality of openings 503. That is, the semiconductor device A1 may determine the position suitable when bonding the first connecting member 71 and the position suitable when clamping with the clamp member. Accordingly, the semiconductor device A1 may suppress deformation and cracking of the first lead 5, which is a package structure that may be used to achieve a high quality.

In the semiconductor device A1, the plurality of openings 503 include the plurality of first openings 503a and the plurality of second openings 503b. According to this configuration, the regions to be pressed by the clamp member (the positions of the pair of outer portions 511) may be determined by the plurality of first openings 503a, and the region to be bonded with the first connecting member 71 (the position of the inner portion 512) may be determined by the plurality of second openings 503b. For example, in the examples shown in FIG. 4 and the like, referring to the pair of first openings 503a, it may be determined that both outer regions of the pair of first openings 503a are the positions of the pair of outer portions 511, i.e., the regions where the clamping may be performed. Further, for example, in the examples shown in FIG. 4 and the like, referring to the plurality of second openings 503b, it may be determined that the regions outside the second openings 503b are the positions of the connecting portions 521 (second portions 52), i.e., the regions unsuitable when bonding the first connecting member 71.

Next, other embodiments of the semiconductor device of the present disclosure will be described.

Figure 16:
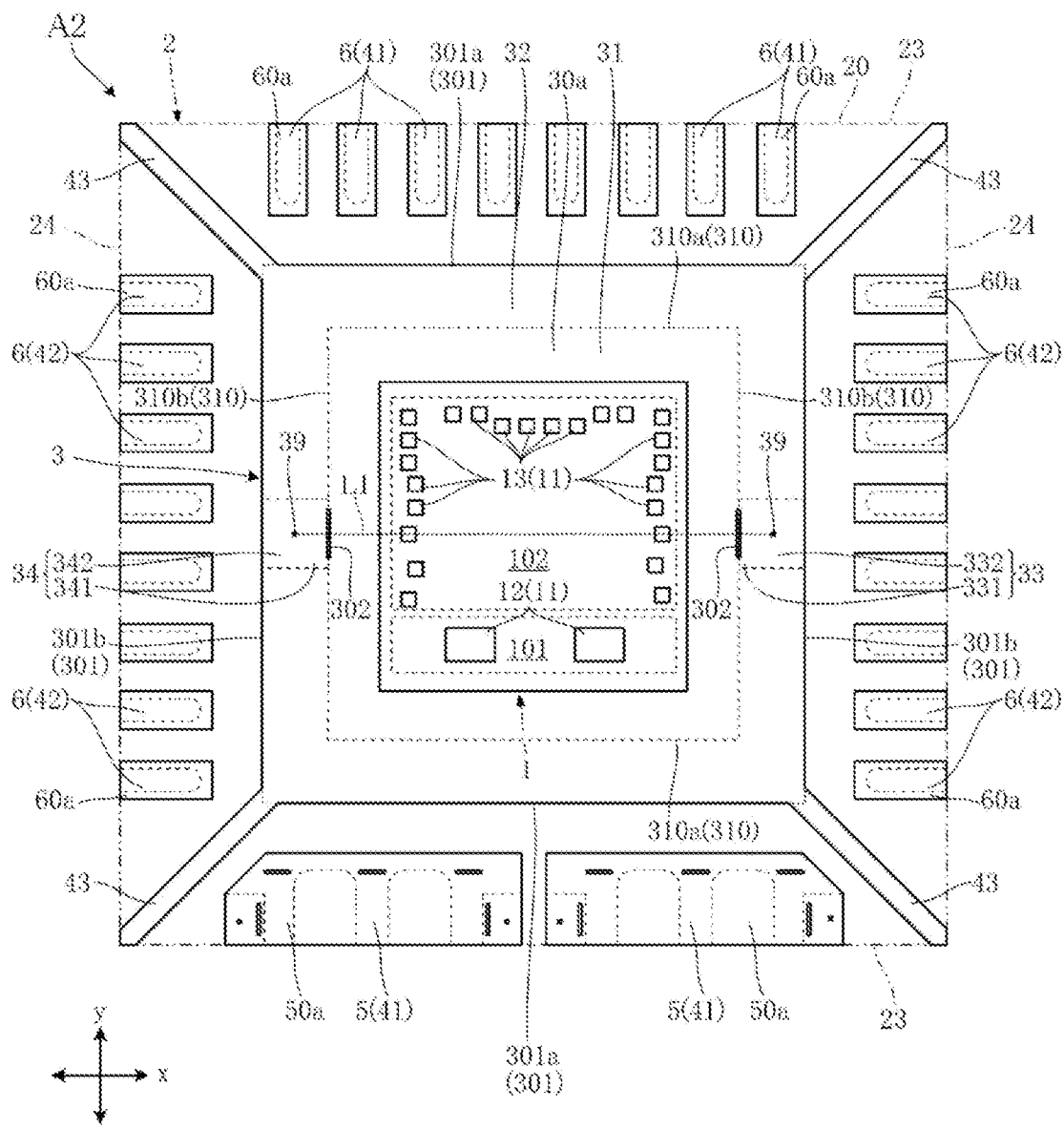
FIG. 16 is a plan view showing a semiconductor device according to a second embodiment of the present disclosure and is a view in which a resin member is made transparent and a plurality of connecting members are omitted.

FIG. 16 shows a semiconductor device A2 according to a second embodiment of the present disclosure. As shown in FIG. 16, in the semiconductor device A2, the third portion 33 and the fourth portion 34 are rectangular in a plan view. That is, in the semiconductor device A2, as compared with the semiconductor device A1, the third portion 33 does not include the tapered portion 331, and the fourth portion 34 does not include the tapered portion 341.

The semiconductor device A2 has the same effects as the semiconductor device A1.

However, in the semiconductor device A2, the third portion 33 and the fourth portion 34 do not include the tapered portions 331 and 341. Therefore, the distance between each opening 302 and the second portion 32 close to each opening 302 becomes short. Accordingly, the widths (the dimensions in the second direction x in FIG. 16) of the third portion 33 and the fourth portion 34 may be increased or the length (the dimension in the second direction x in FIG. 16) of each opening 302 may be decreased to suppress a decrease in the rigidity of the die pad 3.

Figure 17:
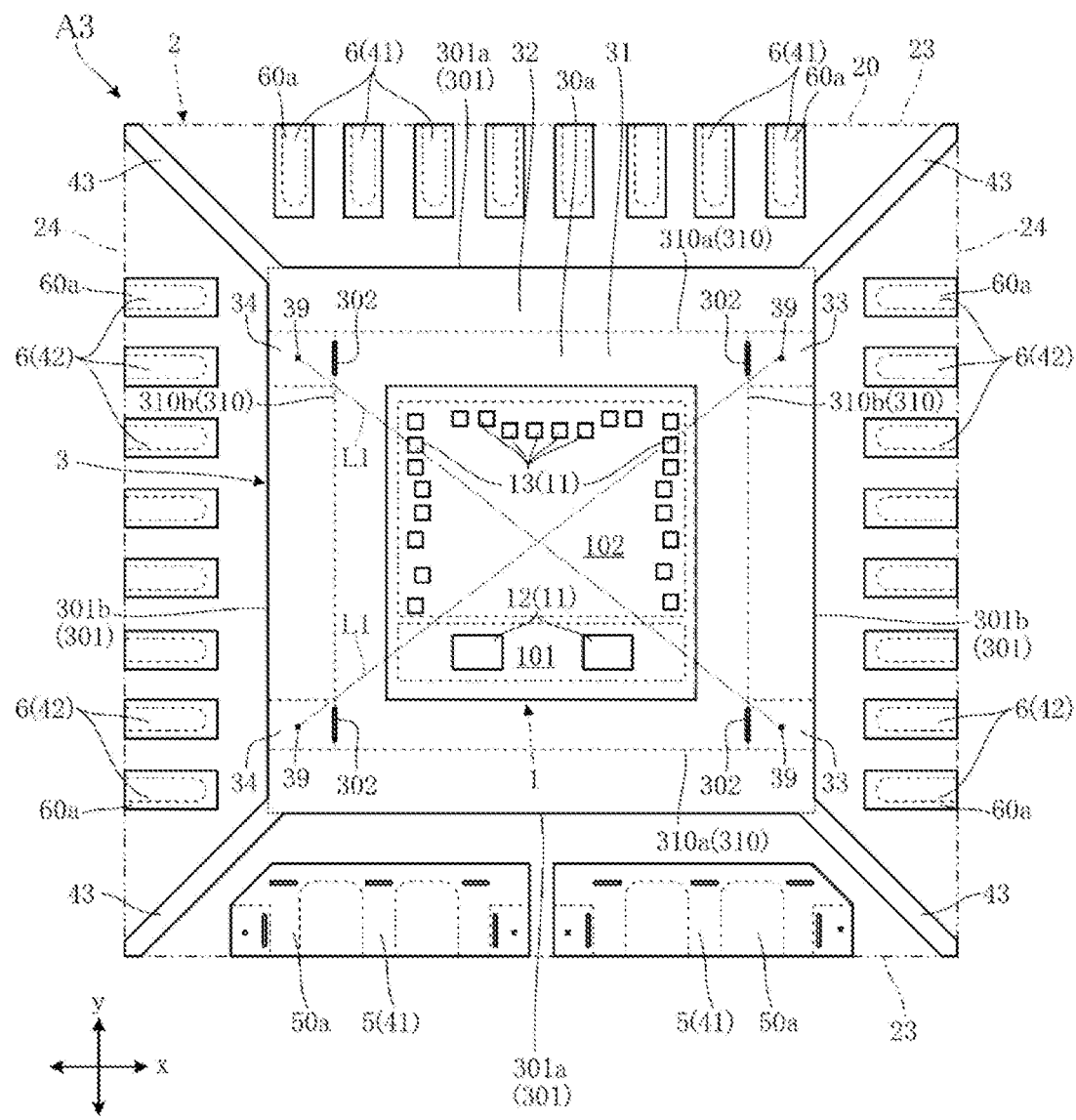
FIG. 17 is a plan view showing a semiconductor device according to a third embodiment of the present disclosure and is a view in which a resin member is made transparent and a plurality of connecting members are omitted.

FIG. 17 shows a semiconductor device A3 according to a third embodiment of the present disclosure. As shown in FIG. 17, in the semiconductor device A3, the die pad 3 includes two third portions 33 and two fourth portions 34. The two third portions 33 are arranged along the first direction y on one side of the die pad 3 in the second direction x. In the example shown in FIG. 17, the two third portions 33 are connected to both ends of one of the pair of end edges 310b in the first direction y. Similarly, the two fourth portions 34 are arranged along the first direction y on the other side of the die pad 3 in the second direction x. In the example shown in FIG. 17, the two fourth portions 34 are respectively connected to both ends of the other of the pair of end edges 310b in the first direction y.

In the semiconductor device A3, when the die pad 3 is fixed by the clamp member, a total of four locations including the two third portions 33 and the two fourth portions 34 may be clamped by the clamp member.

In the semiconductor device A3, as shown in FIG. 17, in the plan view, two line segments L1 connecting the third portions 33 and the fourth portions 34 respectively arranged at diagonal corners of the first portion 31 respectively overlap with the semiconductor element 1. In particular, in the plan view, an intersection of the two line segments L1 overlaps with the central portion of the semiconductor element 1.

The semiconductor device A3 has the same effects as those of the semiconductor device A1. In the semiconductor device A3, when the die pad 3 is fixed by the clamp member, four points are pressed by the clamp member. Therefore, the semiconductor device A3 has a package structure which is more suitable than that of the semiconductor device A1 when fixing the die pad 3 (and the semiconductor element 1 mounted on the die pad 3) more stably. In particular, in the plan view, the intersection of the two line segments L1 overlaps with the central portion of the semiconductor element 1, which is suitable when fixing the semiconductor element 1.

In the third embodiment, there is shown the example in which the die pad 3 of the semiconductor device A3 includes two third portions 33 and two fourth portions 34. However, the number of the third portions 33 and the number of the fourth portions 34 may be three or more.

Figure 18:
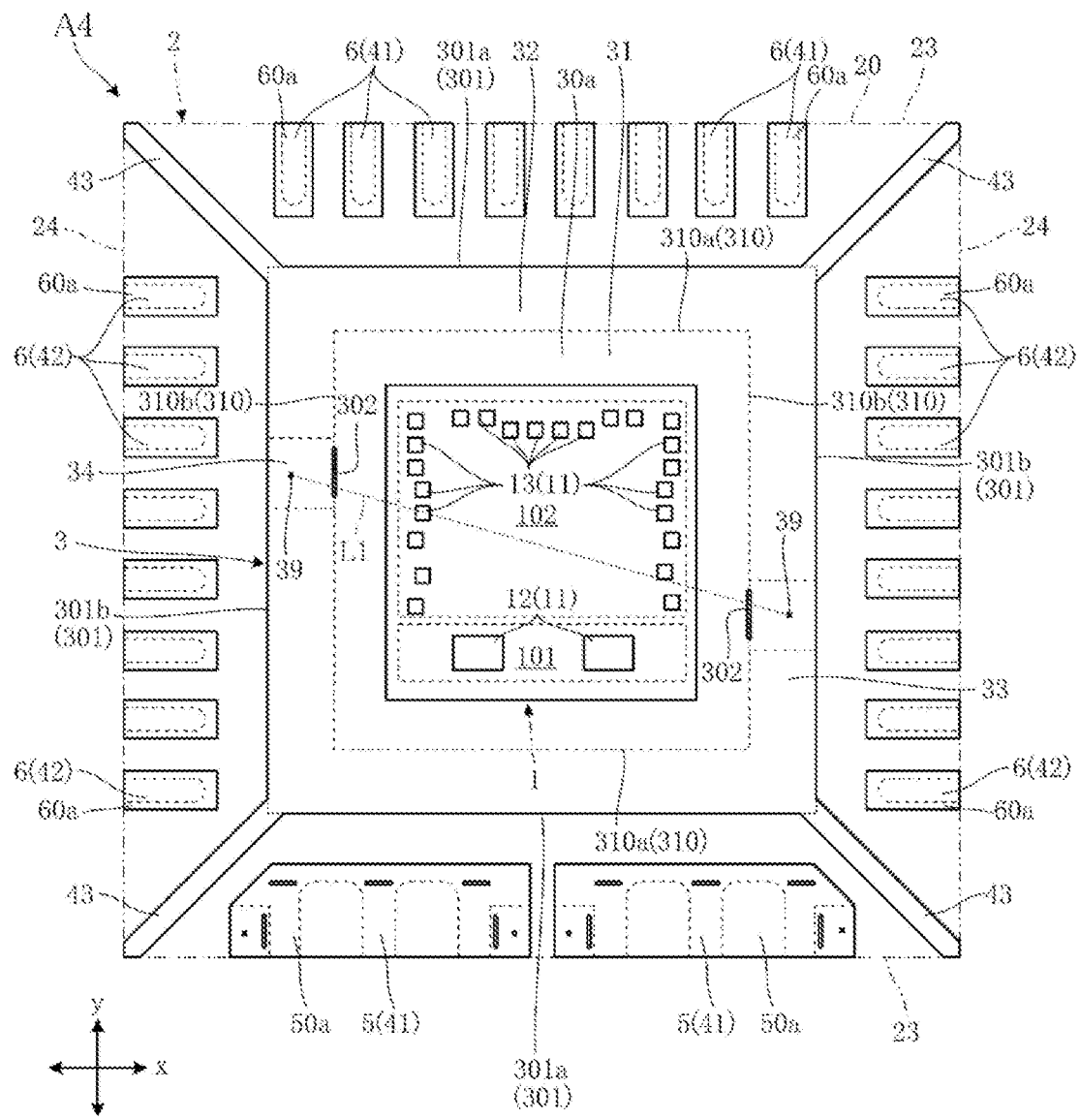
FIG. 18 is a plan view showing a semiconductor device according to a fourth embodiment of the present disclosure and is a view in which a resin member is made transparent and a plurality of connecting members are omitted.

FIG. 18 shows a semiconductor device A4 according to a fourth embodiment of the present disclosure. As shown in FIG. 18, in the semiconductor device A4, the third portion 33 and the fourth portion 34 are arranged to be out of alignment with each other in the first direction y. In the example shown in FIG. 18, the third portion 33 is out of alignment from the center to the other side (the lower side in FIG. 18) of one of the pair of end edges 310b in the first direction y. On the other hand, the fourth portion 34 is out of alignment from the center to one side (the upper side in FIG. 18) of the other one of the pair of end edges 310b in the first direction y.

The same effects as mentioned above may be obtained in the semiconductor device A4.

As may be understood from the semiconductor device A4, in the semiconductor device of the present disclosure, a positional relationship between the third portion 33 and the fourth portion 34 is not limited to a positional relationship in which the third portion 33 and the fourth portion 34 overlap with each other when viewed in the second direction x.

Figure 19:
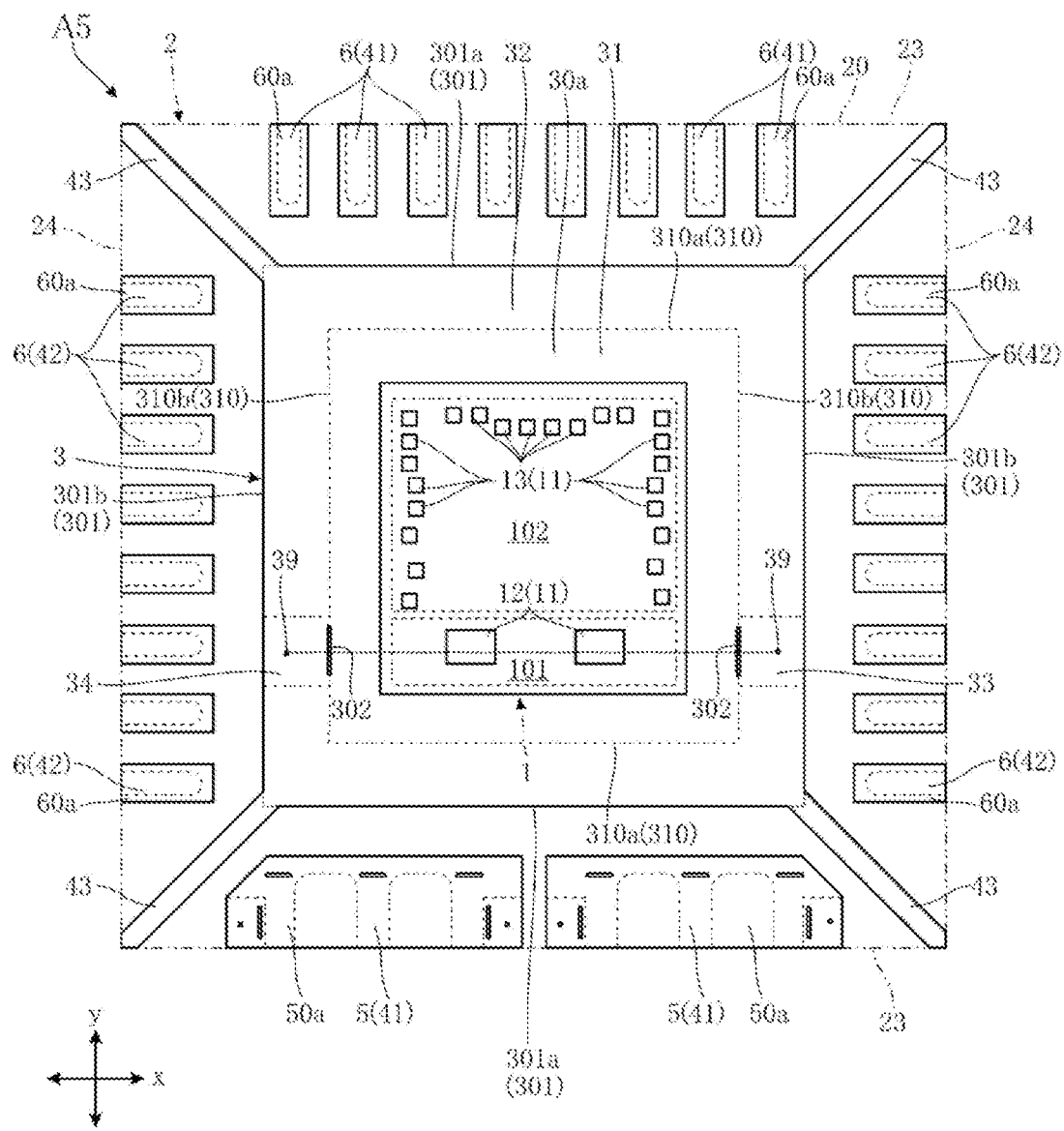
FIG. 19 is a plan view showing a semiconductor device according to a fifth embodiment of the present disclosure and is a view in which a resin member is made transparent and a plurality of connecting members are omitted.

FIG. 19 shows a semiconductor device A5 according to a fifth embodiment of the present disclosure. As shown in FIG. 19, in the semiconductor device A5, the third portion 33 and the fourth portion 34 are arranged closer to one side or the other side in the first direction y. The first connecting member 71 is bonded to the first main surface electrode 12. An ultrasonic vibration at the time of wedge-bonding the first connecting member 71 is transmitted from the first main surface electrode 12. Therefore, in the semiconductor device A5, the third portion 33 and the fourth portion 34 are arranged with each first main surface electrode 12 as a reference. In the example shown in FIG. 19, the third portion 33 and the fourth portion 34 are arranged such that the line segment L1 connecting the third portion 33 and the fourth portion 34 overlaps with each first main surface electrode 12 in the plan view.

The same effects as mentioned above may be obtained in the semiconductor device A5. As understood from the semiconductor device A5, the semiconductor device of the present disclosure is not limited to the configuration in which each of the third portion 33 and the fourth portion 34 is connected to the central portion of each end edge 310a in the first direction y.

In the examples shown in FIGS. 17 to 19, each third portion 33 has a configuration that does not include the tapered portion 331 as in the semiconductor device A2. Unlike this configuration, in each of the semiconductor devices A3 to A5, each third portion 33 may have a configuration that includes the tapered portion 331 as in the semiconductor device A1. In the examples shown in FIGS. 17 to 19, each fourth portion 34 has a configuration that does not include the tapered portion 341 as in the semiconductor device A2. Unlike this configuration, in each of the semiconductor devices A3 to A5, each fourth portion 34 may have a configuration that includes the tapered portion 341 as in the semiconductor device A1.

Figure 20:
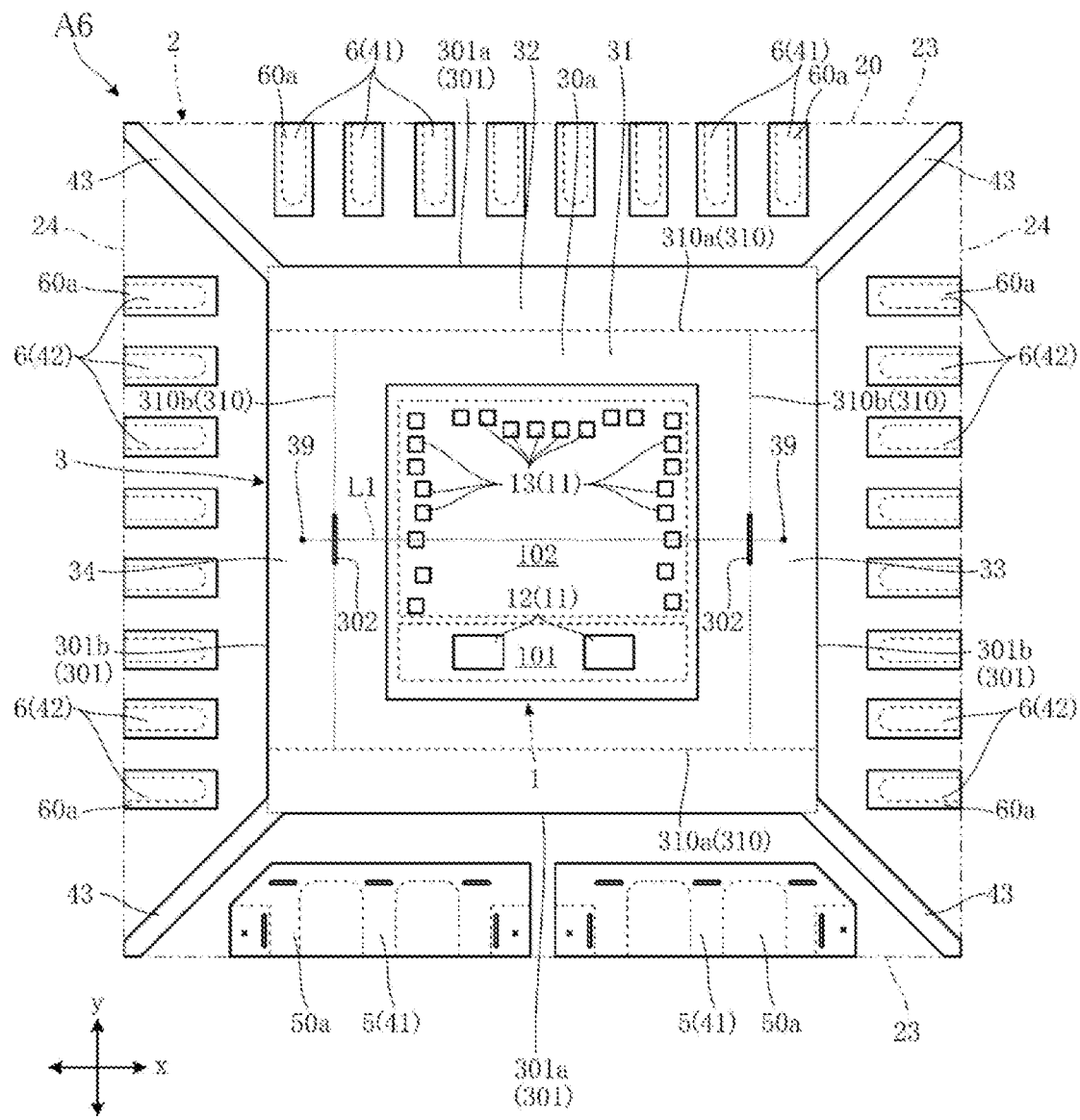
FIG. 20 is a plan view showing a semiconductor device according to a sixth embodiment of the present disclosure and is a view in which a resin member is made transparent and a plurality of connecting members are omitted.

FIG. 20 shows a semiconductor device A6 according to a sixth embodiment of the present disclosure. As shown in FIG. 20, in the semiconductor device A6, the third portion 33 is connected to one of the pair of end edges 310b over the entire length thereof. Similarly, in the semiconductor device A6, the fourth portion 34 is connected to the other one of the pair of end edge 310b over the entire length thereof. Each of the third portion 33 and the fourth portion 34 coincides with the first portion 31 when viewed in the second direction x. In this configuration, the second portions 32 are arranged on one side and the other side in the first direction y with the first portion 31 interposed therebetween in the plan view. The die pad 3 of the semiconductor device A6 is formed, for example, without performing half etching on the opposite sides of the die pad 3 in the second direction x in the plan view.

The semiconductor device A6 has the same effects as those of the semiconductor device A1. In the semiconductor device A6, a plan-view area of each of the third portion 33 and the fourth portion 34 is larger than that in the semiconductor device A1. That is, the semiconductor device A6 has a larger suitable area when pressing the die pad 3 with the clamp member than the semiconductor device A1. As a result, in the semiconductor device A6, the die pad 3 and the semiconductor element 1 may be fixed more stably by providing more locations to be pressed by the clamp member or making the tip portions of the clamp member larger. FIG. 20 shows a case where the pair of openings 302 and the pair of clamp marks 39 are formed in the same manner as in the semiconductor device A1, but appropriate changes may be made thereto due to an increase in the locations to be pressed by the clamp member and a change in the tip portions of the clamp member.

Figure 21:
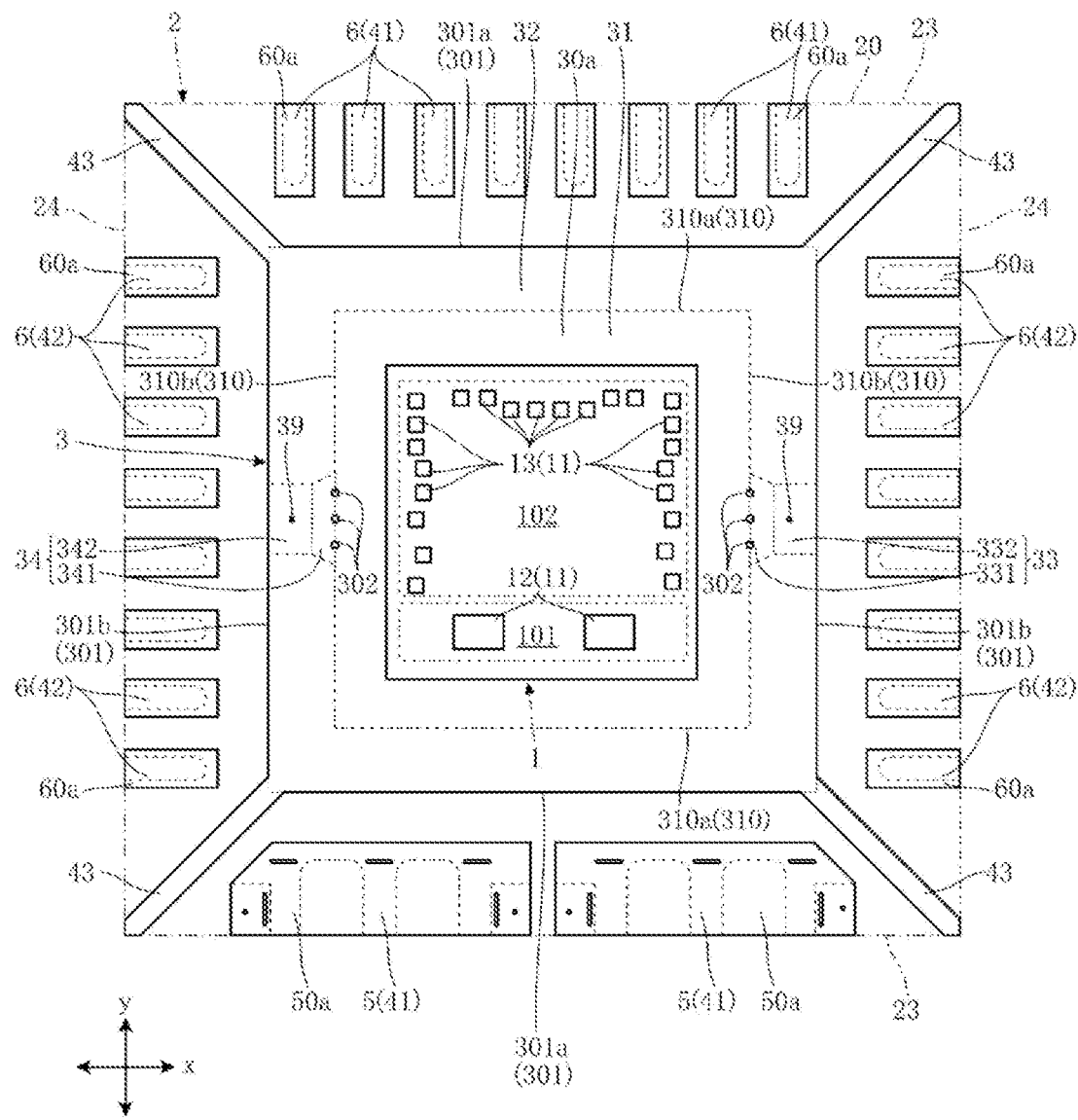
FIG. 21 is a plan view showing a semiconductor device according to a modification of the present disclosure and a view in which a resin member is made transparent and a plurality of connecting members are omitted.

In the first to sixth embodiments of the present disclosure, there is shown the example in which each opening 302 has a linear shape extending in the first direction y in the plan view. Unlike this configuration, each opening 302 may be dot-shaped in the plan view. In this case, a plurality of openings 302 may be arranged along the first direction y at each of the boundary between the first portion 31 and the third portion 33 and the boundary between the first portion 31 and the fourth portion 34. For example, FIG. 21 shows an example in which a plurality of dot-shaped openings 302 are formed at each of the above-mentioned boundaries in the semiconductor device A1. In the example shown in FIG. 21, three openings 302 are formed at each of the above-mentioned boundaries, and the three openings 302 are arranged along the first direction y. The number of openings 302 formed at each boundary is not limited to the three as shown in FIG. 21. In the example in which the third portion 33 and the fourth portion 34 extend from the pair of end edges 310b in the plan view, at each of the above-mentioned boundaries, the pair of openings 302 located at both ends in the first direction y among the plurality of openings 302 overlap with the third portion 33 (band-shaped portion 332) and the fourth portion 34 (band-shaped portion 342) when viewed in the second direction x. Even in the example shown in FIG. 21, the positions of the third portion 33 and the fourth portion 34 may be determined based on the plurality of openings 302.

Figure 22:
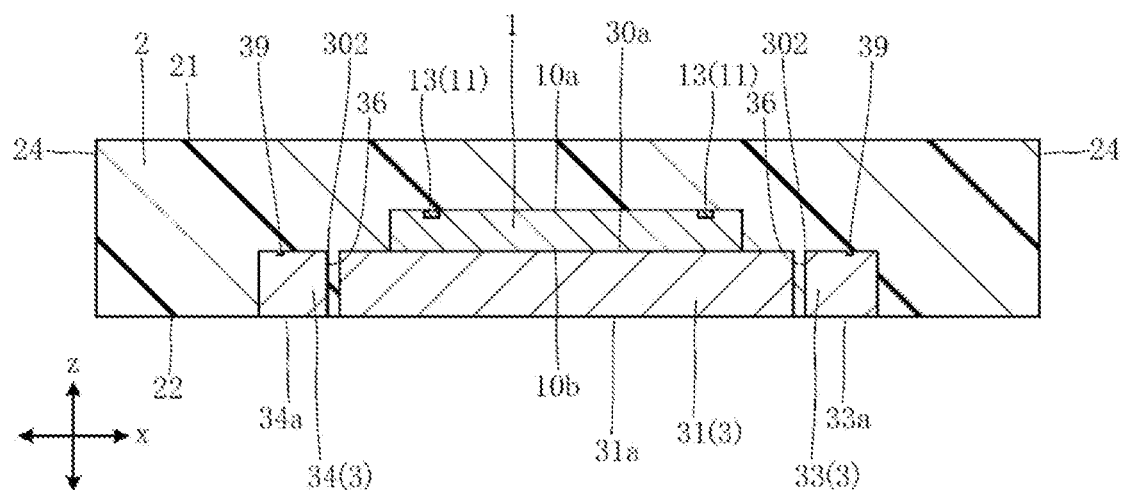
FIG. 22 is a cross-sectional view showing a semiconductor device according to a modification of the present disclosure and is a view corresponding to the cross section shown in FIG. 10.

In the first to sixth embodiments of the present disclosure, there is shown the example in which the plurality of recesses 35 are formed in the die pad 3. However, a through-hole may be formed in place of each recess 35. The through-hole is configured to include each opening 302 formed in the die pad main surface 30a, and is formed to penetrate the die pad 3 in the thickness direction z. For example, FIG. 22 shows an example in which a through-hole 36 including an opening 302 is formed in the die pad 3. FIG. 22 is a cross-sectional view and corresponds to the cross section shown in FIG. 10.

Figure 23:
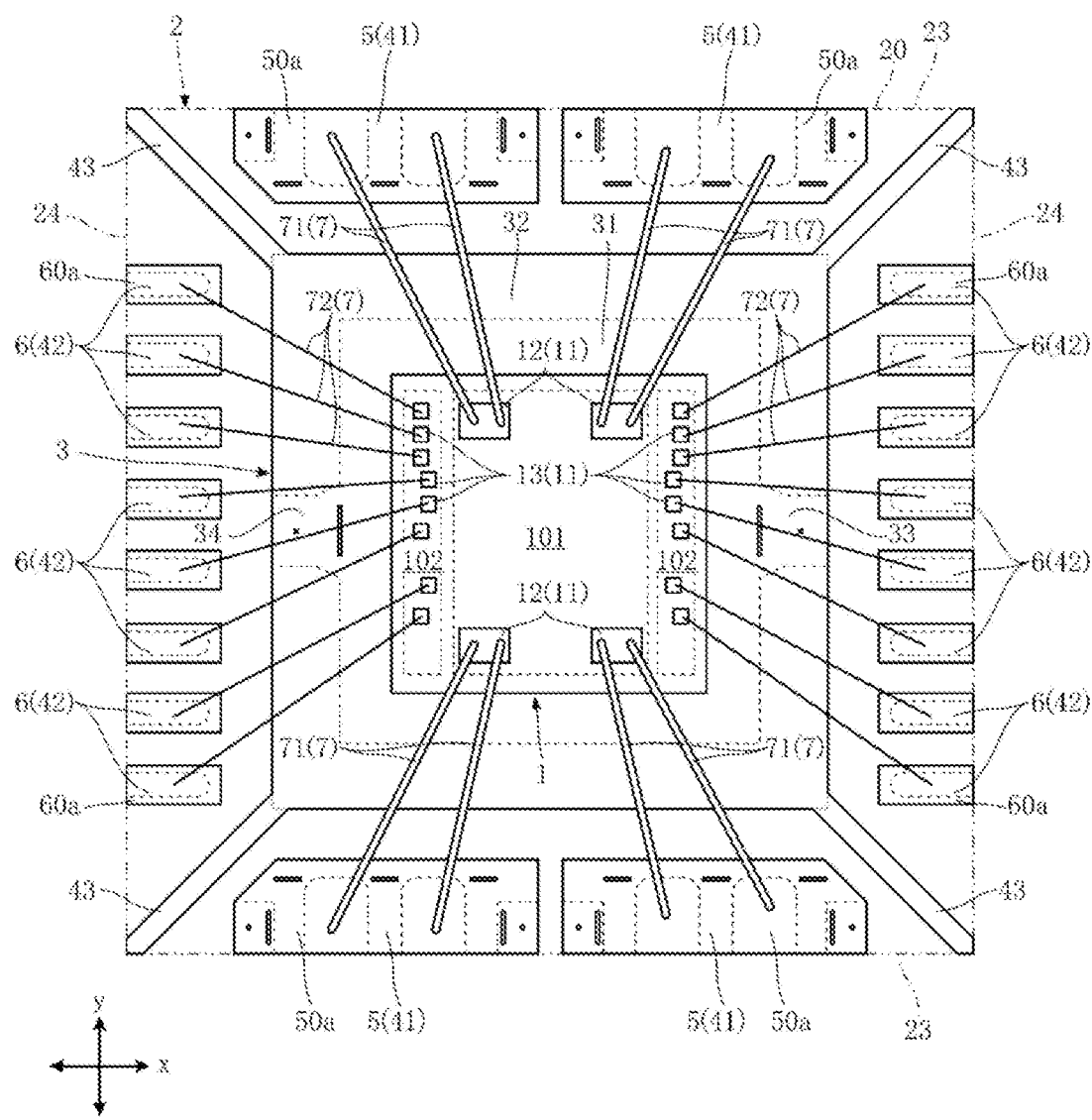
FIG. 23 is a plan view showing a semiconductor device according to a modification of the present disclosure and is a view in which a resin member is made transparent.
Figure 24:
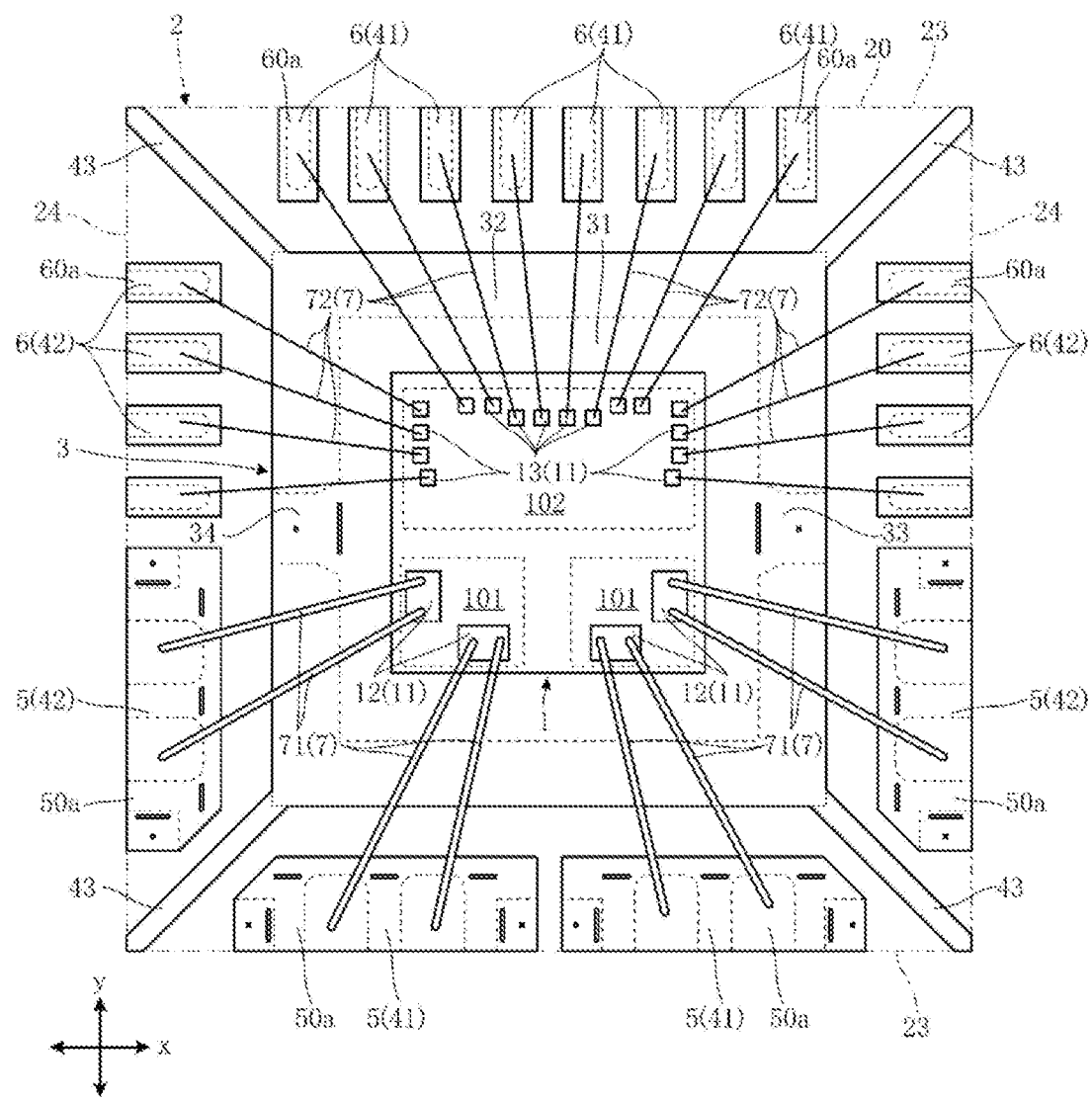
FIG. 24 is a plan view showing a semiconductor device according to a modification of the present disclosure and is a view in which a resin member is made transparent.

In the first to sixth embodiments of the present disclosure, the number, arrangement, size, and the like of the first lead 5 and the second lead 6 in the plurality of leads 4 may be appropriately changed depending on the configuration of the semiconductor element 1. The configuration of the semiconductor element 1 includes the number and arrangement of the power component 101, the number and arrangement of the control circuit component 102, the number and arrangement of the plurality of main surface electrodes 11 (the first main surface electrodes 12 and the second main surface electrodes 13), and so forth. For example, as shown in FIG. 23, the plurality of first side leads 41 may not include the second lead 6 but may include the plurality of first leads 5. In the example shown in FIG. 23, for example, when the first main surface electrodes 12 are arranged on both sides of the semiconductor element 1 in the first direction y, it is possible to shorten the distance from each first main surface electrode 12 to each first lead 5. Alternatively, as shown in FIG. 24, the plurality of first side leads 41 may include the first lead 5 and the second lead 6, and the plurality of second side leads 42 may include the first lead 5 and the second lead 6. In the example shown in FIG. 24, for example, when the plurality of first main surface electrodes 12 are collectively arranged on the other side (the lower side in FIG. 24) of the semiconductor element 1 in the first direction y in the plan view, it is possible to shorten the distance from each first main surface electrode 12 to each first lead 5. Further, in the example shown in the semiconductor device A1 (see FIG. 3 and the like) and FIGS. 23 and 24, the two first leads 5 are arranged along one of the pair of first resin side surfaces 23. However, the number of the first leads 5 arranged along any one of the pair of first resin side surfaces 23 or the pair of second resin side surfaces 24 is not limited to two and may be one or three or more.

Figure 25:
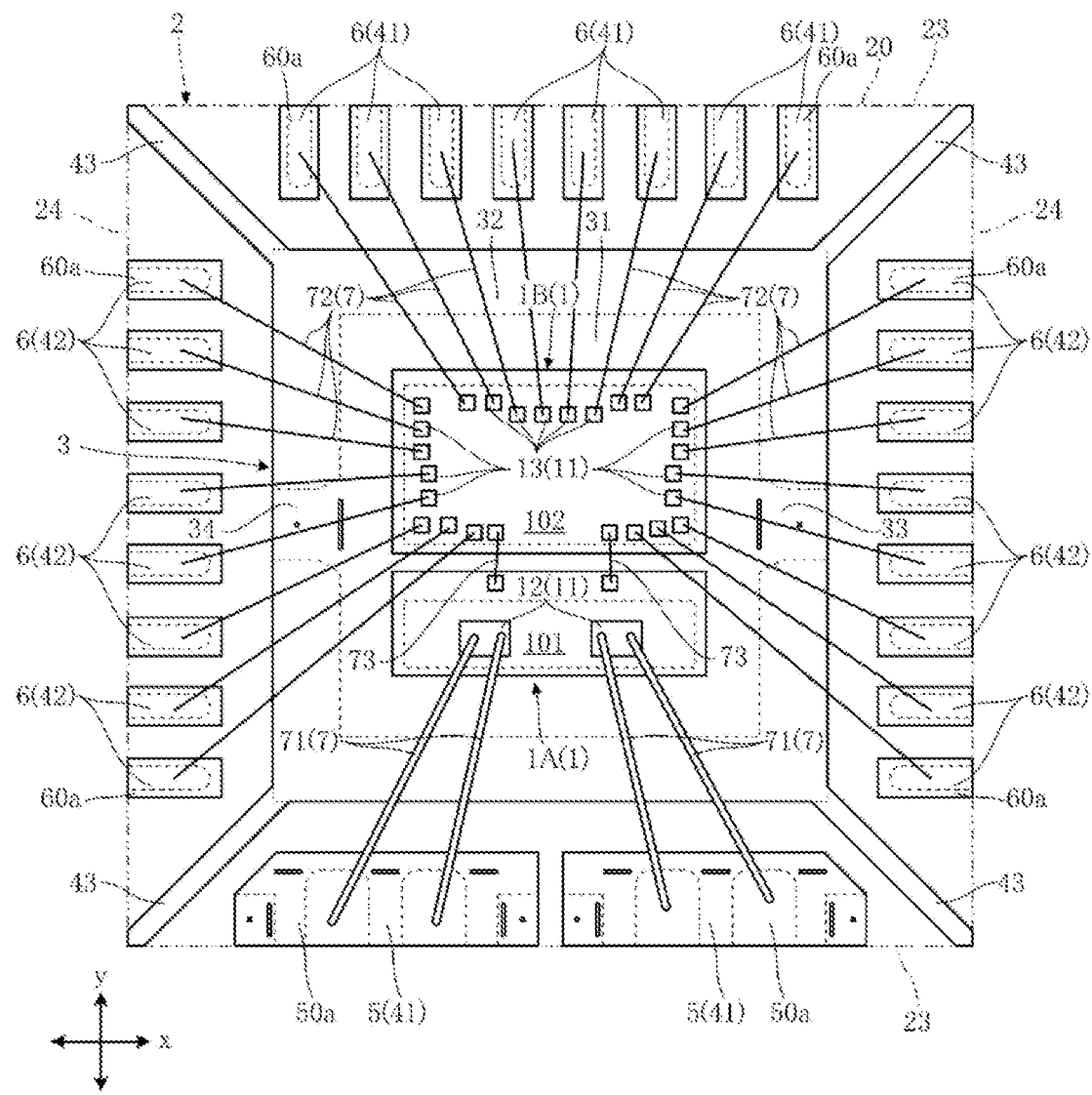
FIG. 25 is a plan view showing a semiconductor device according to a modification of the present disclosure and is a view in which a resin member is made transparent.

In the first to the sixth embodiments of the present disclosure, each of the semiconductor devices A1 to A6 includes one semiconductor element 1. Unlike this configuration, each of the semiconductor devices A1 to A6 may include a plurality of semiconductor elements 1. For example, FIG. 25 shows an example in which the semiconductor device includes two semiconductor elements 1. In the example shown in FIG. 25, the two semiconductor elements 1 include a semiconductor element 1A including a power component 101 and a semiconductor element 1B including a control circuit component 102. The semiconductor element 1A is, for example, a power element such as a transistor. The semiconductor element 1B is a driver IC that controls a switching operation of the semiconductor element 1A. The semiconductor device shown in FIG. 25 includes a third connecting member 73 that electrically connects the semiconductor element 1A and the semiconductor element 1B. The third connecting member 73 is, for example, a bonding wire. A detection signal from the semiconductor element 1A to the semiconductor element 1B and a drive signal that controls a switching operation from the semiconductor element 1B to the semiconductor element 1A are transmitted via the third connecting member 73. Although FIG. 25 shows the example in which the semiconductor device includes two semiconductor elements 1, the number of semiconductor elements 1 may be three or more.

Figure 26:
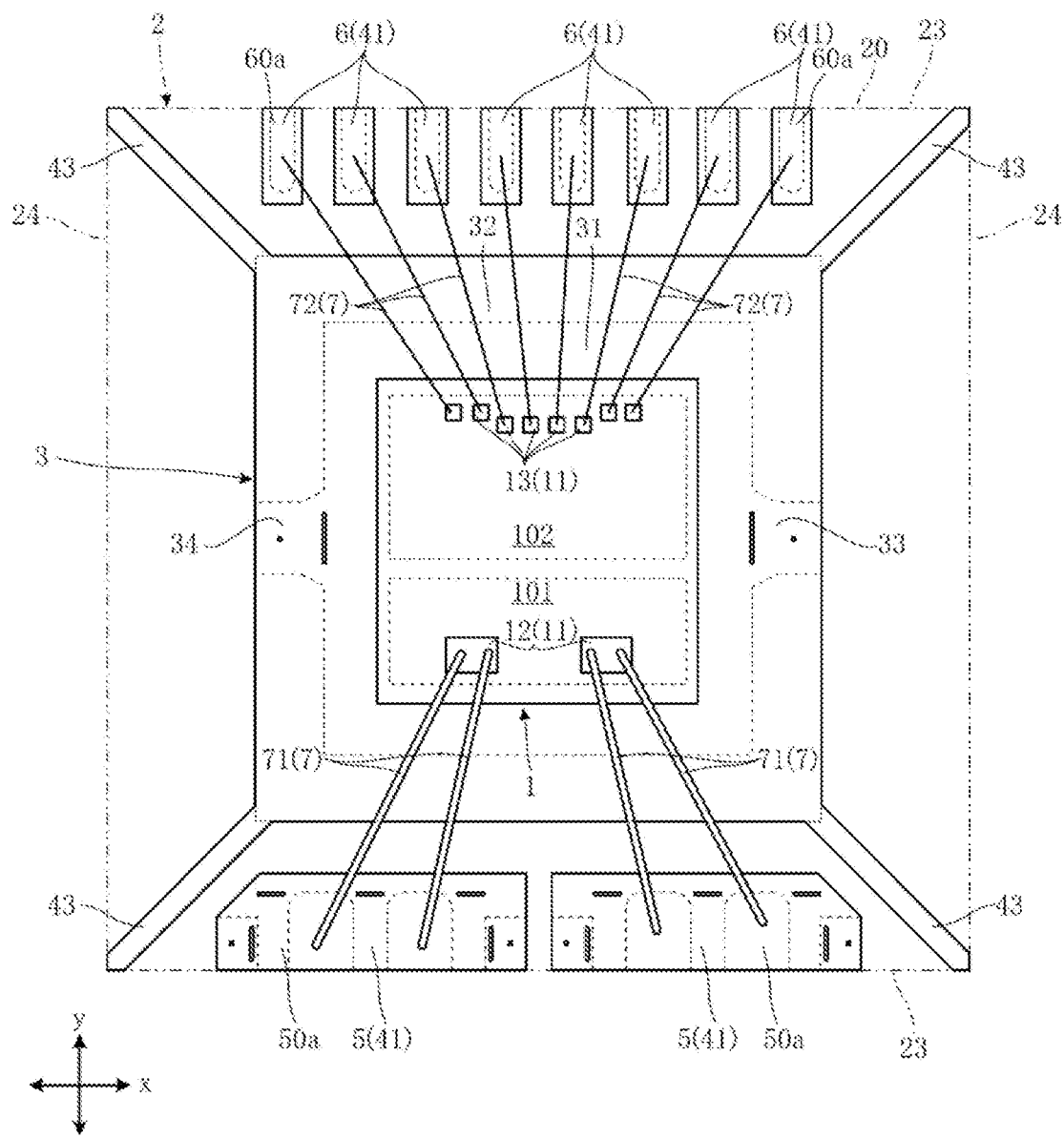
FIG. 26 is a plan view showing a semiconductor device according to a modification of the present disclosure and is a view in which a resin member is made transparent.

In the first to sixth embodiments of the present disclosure, each of the semiconductor devices A1 to A6 has a package structure of MAP type QFN. However, each of the semiconductor devices A1 to A6 may have another package structure (e.g., MAP type SON). FIG. 26 shows an example in which the package structure is a MAP type SON. Since the semiconductor device shown in FIG. 26 is a SON package, the plurality of leads 4 do not include the second side lead 42. As may be understood from the example shown in FIG. 26, the semiconductor device of the present disclosure is not limited to QFN and may apply to other package structures. In the example shown in FIG. 26, like the semiconductor devices A1 to A6, the plurality of third leads 43 are formed to extend from four corners of the die pad 3 to four corners of the resin member 2 in the plan view. Unlike this example, the respective third leads 43 may extend from the four corners of the die pad 3 to be parallel to the second direction x. Alternatively, unlike this example, the two third leads 43 may extend from the third portion 33 and the fourth portion 34 of the die pad 3 along the second direction x.

In the first to sixth embodiments of the present disclosure, each of the semiconductor devices A1 to A6 includes the plurality of third leads 43. However, unlike this configuration, each of the semiconductor devices A1 to A6 may not include the third leads 43. Such a configuration that does not include the third leads 43 may also apply to the above-mentioned other modifications (see FIGS. 21 to 26).

In the first to the sixth embodiments of the present disclosure, there is shown the example in which the first lead 5 is formed with the notch 505. However, unlike this configuration, the first lead 5 may not have the notch 505. In the configuration without the notch 505, the first lead 5 has, for example, a rectangular shape in the plan view.

Figure 27:
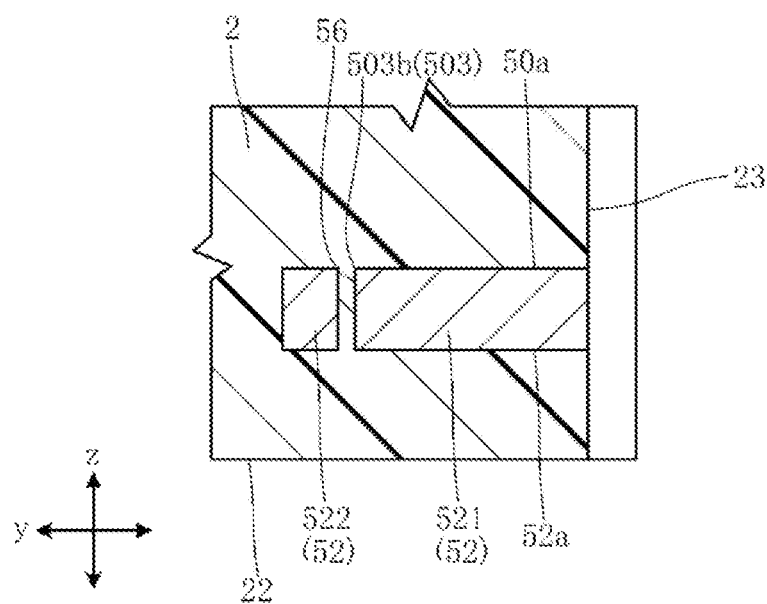
FIG. 27 is an enlarged cross-sectional view of a main part showing a first lead according to a modification of the present disclosure.

In the first to sixth embodiments of the present disclosure, there is shown the example in which the plurality of recesses 55 are formed in the first lead 5. However, a through-hole may be formed in place of each recess 55. The through-hole is configured to include each opening 503 (the first opening 503a or the second opening 503b) formed in the first pad surface 50a. The through-hole penetrates the first lead 5 in the thickness direction z. For example, FIG. 27 shows an example in which a through-hole 56 including the second opening 503b is formed in the first lead 5. FIG. 27 is an enlarged cross-sectional view of a main part and corresponds to the cross section shown in FIG. 14. The second portion 52 is formed by half-etching from the lower surface of the first lead 5 in the thickness direction z. Therefore, when the second opening 503b is formed in the second portion 52 by half etching from the first pad surface 50a, as shown in FIG. 27, the through-hole 56 penetrating the second portion 52 is easily formed.

In the first to sixth embodiments of the present disclosure, there is shown the example in which the plurality of second openings 503b are arranged to indicate regions unsuitable for bonding the first connecting member 71 in each first lead 5. Contrary to this example, the plurality of second openings 503b may be arranged to indicate regions suitable for bonding to the first connecting member 71. For example, the plurality of second openings 503b may be arranged at the boundary between the inner portion 512 and the connecting portion 522, or the plurality of second openings 503b may be arranged at the boundary between the inner portion 512 and the connecting portion 522.

In the first to sixth embodiments of the present disclosure, the pair of openings 302 are formed on the die pad main surface 30a of the die pad 3. However, unlike this configuration, the openings 302 may not be formed. Similarly, although the plurality of openings 503 are formed on the first pad surface 50a of the first lead 5, unlike this configuration, the openings 503 may not be formed.

In the first to sixth embodiments of the present disclosure, the plurality of first side leads 41 include the first lead 5. However, unlike this configuration, the first lead 5 may not be included. That is, the plurality of leads 4 (the plurality of first side leads 41 and the plurality of second side leads 42) may all be composed of the second leads 6. In the example in which such a plurality of leads 4 are all composed of the second leads 6, wedge bonding may not be performed. However, the die pad 3 may be fixed by a clamp member to stabilize a posture of the die pad 3 at the time of manufacturing or to mount the semiconductor element 1 on the die pad 3. Therefore, even in a configuration where wedge bonding may not be used, the die pad 3 may be provided with the third portion 33 and the fourth portion 34.

The semiconductor device according to the present disclosure is not limited to the above-described embodiments. The specific configuration of each part of the semiconductor device of the present disclosure may be variously changed in design. For example, the semiconductor device of the present disclosure includes embodiments relating to the following supplementary notes.

Supplementary Note 1

A semiconductor device, including:
a semiconductor element having an element main surface and an element back surface spaced apart from each other in a thickness direction and including a plurality of main surface electrodes arranged on the element main surface;

a die pad having a die pad main surface on which the
semiconductor element is mounted;
a plurality of leads including at least one first lead
arranged on one side in a first direction orthogonal to
the thickness direction with respect to the die pad, and
arranged around the die pad when viewed in the
thickness direction;
a plurality of connecting members including a first con-
necting member bonded to the at least one first lead,
and configured to electrically connect the plurality of
main surface electrodes and the plurality of leads; and
a resin member configured to seal the semiconductor
element, a part of the die pad, parts of the plurality of
leads, and the plurality of connecting members,
wherein each of the plurality of leads is configured to
entirely overlap with the resin member when viewed in
the thickness direction and arranged along an outer
edge of the resin member when viewed in the thickness
direction,
wherein the die pad includes a first portion, a second
portion, a third portion, and a fourth portion,
wherein the die pad main surface spans the first portion,
the second portion, the third portion, and the fourth
portion,
wherein the first portion has a first back surface facing a
side opposite to the die pad main surface and overlaps
with the semiconductor element when viewed in the
thickness direction,
wherein the second portion has a second back surface
facing a side opposite to the die pad main surface and
located closer to the die pad main surface than the first
back surface in the thickness direction, and is con-
nected to an outer edge of the first portion when viewed
in the thickness direction,
wherein the third portion has a third back surface facing
a side opposite to the die pad main surface and being
flush with the first back surface, and extends from one
end edge of the first portion to one end edge of the die
pad main surface in a second direction orthogonal to
the thickness direction and the first direction, and
wherein the fourth portion has a fourth back surface
facing a side opposite to the die pad main surface and
being flush with the first back surface, and extends from
the other end edge of the first portion to the other end
edge of the die pad main surface in the second direc-
tion.

Supplementary Note 2

The semiconductor device of Supplementary Note 1,
wherein each of the first portion, the third portion, and the
fourth portion has a surface opposite to the die pad main
surface and exposed from the resin member.

Supplementary Note 3

The semiconductor device of Supplementary Note 1 or 2,
wherein the die pad main surface includes a plurality of
openings, and
wherein the plurality of openings is formed at a location
where the first portion and the third portion are con-
nected and a location where the first portion and the
fourth portion are connected.

Supplementary Note 4

The semiconductor device of Supplementary Note 3,
wherein the die pad has a plurality of recesses recessed in the
thickness direction from the die pad main surface, and
wherein each of the plurality of recesses includes each of
the plurality of openings.

Supplementary Note 5

The semiconductor device of any one of Supplementary
Notes 1 to 4, wherein each of the third portion and the fourth
portion includes a tapered portion connected to the outer
edge of the first portion and a band-shaped portion extending
from the tapered portion to an outer edge of the die pad, and
wherein a width of the tapered portion becomes narrower
toward the band-shaped portion from the outer edge of
the first portion when viewed in the thickness direction.

Supplementary Note 6

The semiconductor device of any one of Supplementary
Notes 1 to 5, wherein the plurality of leads further include
at least one second lead,
wherein the plurality of connecting members further
include a second connecting member,
wherein the at least one first lead has a first pad surface to
which the first connecting member is bonded,
wherein the at least one second lead has a second pad
surface to which the second connecting member is
bonded, and
wherein the first pad surface is larger than the second pad
surface when viewed in the thickness direction.

Supplementary Note 7

The semiconductor device of Supplementary Note 6,
wherein the resin member has a resin back surface, a pair of
first resin side surfaces, and a pair of second resin side
surfaces,
wherein the resin back surface faces the same direction as
the element back surface in the thickness direction,
wherein the pair of first resin side surfaces are spaced
apart from each other in the first direction,
wherein the pair of second resin side surfaces are spaced
apart from each other in the second direction, and
wherein each of the plurality of leads is exposed from the
resin back surface.

Supplementary Note 8

The semiconductor device of Supplementary Note 7,
wherein the plurality of leads include a plurality of first side
leads, which are arranged such that the die pad is interposed
among the plurality of first side leads in the first direction
and respectively exposed from any one of the pair of first
resin side surfaces, and
wherein the plurality of first side leads include one or
more of the at least one first lead.

Supplementary Note 9

The semiconductor device of Supplementary Note 8,
wherein the plurality of leads include a plurality of second
side leads, which are arranged such that the die pad is
interposed among the plurality of second side leads in the
second direction and respectively exposed from any one of
the pair of second resin side surfaces, and
wherein the plurality of second side leads include one or
more of the at least one second lead.

Supplementary Note 10

The semiconductor device of Supplementary Note 9, wherein the plurality of second side leads do not include the at least one first lead.

Supplementary Note 11

The semiconductor device of any one of Supplementary Notes 6 to 10, wherein the plurality of main surface electrodes include a first main surface electrode to which the first connecting member is bonded and a second main surface electrode to which the second connecting member is bonded.

Supplementary Note 12

The semiconductor device of Supplementary Note 11, wherein the semiconductor element includes a power component including a power element and a control circuit component constituting a control circuit of the power element,
    wherein the first main surface electrode is electrically connected to the power component, and
    wherein the second main surface electrode is electrically connected to the control circuit component.

Supplementary Note 13

The semiconductor device of Supplementary Note 11 or 12 wherein the first main surface electrode is located between the third portion and the fourth portion when viewed in the thickness direction.

Supplementary Note 14

The semiconductor device of any one of Supplementary Notes 6 to 13, wherein the first connecting member is a bonding wire bonded by wedge bonding.

Supplementary Note 15

The semiconductor device of any one of Supplementary Notes 1 to 14, further comprising a plurality of third leads extending from an outer edge of the die pad toward the outer edge of the resin member when viewed in the thickness direction.

Supplementary Note 16

The semiconductor device of Supplementary Note 15, wherein the die pad has a rectangular shape when viewed in the thickness direction, and
    wherein the plurality of third leads extend from four corners of the die pad when viewed in the thickness direction.

Supplementary Note 17

The semiconductor device of Supplementary Note 15 or 16, wherein each of the plurality of third leads is connected to the second portion when viewed in the thickness direction.

According to the present disclosure in some embodiments, it is possible to provide a semiconductor device with higher performance and higher quality.

While certain embodiments have been described, these embodiments have been presented by way of example only and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:
1. A semiconductor device, comprising:
    a semiconductor element having an element main surface and an element back surface spaced apart from each other in a thickness direction and including a plurality of main surface electrodes arranged on the element main surface;
    a die pad having a die pad main surface on which the semiconductor element is mounted;
    a plurality of leads including at least one first lead arranged on one side in a first direction orthogonal to the thickness direction with respect to the die pad, and arranged around the die pad when viewed in the thickness direction;
    a plurality of connecting members including a first connecting member bonded to the at least one first lead, and configured to electrically connect the plurality of main surface electrodes and the plurality of leads; and
    a resin member configured to seal the semiconductor element, a part of the die pad, parts of the plurality of leads, and the plurality of connecting members,
    wherein each of the plurality of leads is configured to entirely overlap with the resin member when viewed in the thickness direction and arranged along an outer edge of the resin member when viewed in the thickness direction,
    wherein the die pad includes a first portion, a second portion, a third portion, and a fourth portion,
    wherein the die pad main surface spans the first portion, the second portion, the third portion, and the fourth portion,
    wherein the first portion has a first back surface facing a side opposite to the die pad main surface and overlaps with the semiconductor element when viewed in the thickness direction,
    wherein the second portion has a second back surface facing a side opposite to the die pad main surface and located closer to the die pad main surface than the first back surface in the thickness direction, and is connected to an outer edge of the first portion when viewed in the thickness direction,
    wherein the third portion has a third back surface facing a side opposite to the die pad main surface and being flush with the first back surface, and extends from one end edge of the first portion to one end edge of the die pad main surface in a second direction orthogonal to the thickness direction and the first direction, and
    wherein the fourth portion has a fourth back surface facing a side opposite to the die pad main surface and being flush with the first back surface, and extends from the other end edge of the first portion to the other end edge of the die pad main surface in the second direction.

2. The semiconductor device of claim 1, wherein each of the first portion, the third portion, and the fourth portion has a surface opposite to the die pad main surface and exposed from the resin member.

3. The semiconductor device of claim 1, wherein the die pad main surface includes a plurality of openings, and
wherein the plurality of openings is formed at a location where the first portion and the third portion are connected and a location where the first portion and the fourth portion are connected.

4. The semiconductor device of claim 3, wherein the die pad has a plurality of recesses recessed in the thickness direction from the die pad main surface, and
wherein each of the plurality of recesses includes each of the plurality of openings.

5. The semiconductor device of claim 1, wherein each of the third portion and the fourth portion includes a tapered portion connected to the outer edge of the first portion and a band-shaped portion extending from the tapered portion to an outer edge of the die pad, and
wherein a width of the tapered portion becomes narrower toward the band-shaped portion from the outer edge of the first portion when viewed in the thickness direction.

6. The semiconductor device of claim 1, wherein the plurality of leads further include at least one second lead,
wherein the plurality of connecting members further include a second connecting member,
wherein the at least one first lead has a first pad surface to which the first connecting member is bonded,
wherein the at least one second lead has a second pad surface to which the second connecting member is bonded, and
wherein the first pad surface is larger than the second pad surface when viewed in the thickness direction.

7. The semiconductor device of claim 6, wherein the resin member has a resin back surface, a pair of first resin side surfaces, and a pair of second resin side surfaces,
wherein the resin back surface faces the same direction as the element back surface in the thickness direction,
wherein the pair of first resin side surfaces are spaced apart from each other in the first direction,
wherein the pair of second resin side surfaces are spaced apart from each other in the second direction, and
wherein each of the plurality of leads is exposed from the resin back surface.

8. The semiconductor device of claim 7, wherein the plurality of leads include a plurality of first side leads, which are arranged such that the die pad is interposed among the plurality of first side leads in the first direction and respectively exposed from any one of the pair of first resin side surfaces, and
wherein the plurality of first side leads include one or more of the at least one first lead.

9. The semiconductor device of claim 8, wherein the plurality of leads include a plurality of second side leads, which are arranged such that the die pad is interposed among the plurality of second side leads in the second direction and respectively exposed from any one of the pair of second resin side surfaces, and
wherein the plurality of second side leads include one or more of the at least one second lead.

10. The semiconductor device of claim 9, wherein the plurality of second side leads do not include the at least one first lead.

11. The semiconductor device of claim 6, wherein the plurality of main surface electrodes include a first main surface electrode to which the first connecting member is bonded and a second main surface electrode to which the second connecting member is bonded.

12. The semiconductor device of claim 11, wherein the semiconductor element includes a power component including a power element and a control circuit component constituting a control circuit of the power element,
wherein the first main surface electrode is electrically connected to the power component, and
wherein the second main surface electrode is electrically connected to the control circuit component.

13. The semiconductor device of claim 11, wherein the first main surface electrode is located between the third portion and the fourth portion when viewed in the thickness direction.

14. The semiconductor device of claim 6, wherein the first connecting member is a bonding wire bonded by wedge bonding.

15. The semiconductor device of claim 1, further comprising a plurality of third leads extending from an outer edge of the die pad toward the outer edge of the resin member when viewed in the thickness direction.

16. The semiconductor device of claim 15, wherein the die pad has a rectangular shape when viewed in the thickness direction, and
wherein the plurality of third leads extend from four corners of the die pad when viewed in the thickness direction.

17. The semiconductor device of claim 15, wherein each of the plurality of third leads is connected to the second portion when viewed in the thickness direction.

* * * * *